(12) United States Patent
Jung et al.

(10) Patent No.: US 12,262,614 B2
(45) Date of Patent: Mar. 25, 2025

(54) DISPLAY PANEL AND DISPLAY APPARATUS INCLUDING THE SAME

(71) Applicant: SAMSUNG DISPLAY CO., LTD., Yongin-si (KR)

(72) Inventors: Sunyoung Jung, Yongin-si (KR); Hyunho Kim, Yongin-si (KR); Chungsock Choi, Yongin-si (KR); Gunhee Kim, Yongin-si (KR); Donghwan Shim, Yongin-si (KR); Sanghee Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/642,784

(22) Filed: Apr. 22, 2024

(65) Prior Publication Data

US 2024/0276825 A1  Aug. 15, 2024

Related U.S. Application Data

(62) Division of application No. 17/305,505, filed on Jul. 8, 2021, now Pat. No. 11,974,481.

(30) Foreign Application Priority Data

Oct. 8, 2020  (KR) .................... 10-2020-0130452

(51) Int. Cl.
*H10K 59/131* (2023.01)
*H10K 59/35* (2023.01)

(52) U.S. Cl.
CPC ......... *H10K 59/353* (2023.02); *H10K 59/131* (2023.02)

(58) Field of Classification Search
CPC .......................... H10K 59/131; H10K 59/353
See application file for complete search history.

(56) References Cited

U.S. PATENT DOCUMENTS

| | | | |
|---|---|---|---|
| 2016/0190119 | A1 | 6/2016 | Hwang et al. |
| 2017/0084214 | A1 | 3/2017 | Ono et al. |
| 2018/0211982 | A1 | 7/2018 | Wang et al. |
| 2018/0366586 | A1 | 12/2018 | Son et al. |

FOREIGN PATENT DOCUMENTS

| | | |
|---|---|---|
| CN | 110047897 A | 7/2019 |
| CN | 110867476 A | 3/2020 |
| CN | 110874990 A | 3/2020 |
| CN | 111028692 A | 4/2020 |
| CN | 111063719 A | 4/2020 |
| KR | 10-2020-0037029 A | 4/2020 |

*Primary Examiner* — Douglas M Menz
(74) *Attorney, Agent, or Firm* — Womble Bond Dickinson (US) LLP

(57) ABSTRACT

A display panel includes: a substrate including a main display area, a component area, and a peripheral area; a main sub-pixel and a main pixel circuit, the main sub-pixel being in the main display area on the substrate, and the main pixel circuit being connected to the main sub-pixel; a plurality of auxiliary sub-pixels in the component area on the substrate; a plurality of auxiliary pixel circuits in the peripheral area on the substrate; a plurality of connecting lines connecting the plurality of auxiliary sub-pixels to the plurality of auxiliary pixel circuits, respectively; and a dummy line extending in a direction in which the plurality of connecting lines extend in the component area.

7 Claims, 20 Drawing Sheets

DISPLAY PANEL AND DISPLAY APPARATUS INCLUDING THE SAME

CROSS-REFERENCE TO RELATED APPLICATIONS

This application is a divisional of U.S. patent application Ser. No. 17/305,505, filed Jul. 8, 2021, which claims priority to and the benefit of Korean Patent Application No. 10-2020-0130452, filed Oct. 8, 2020, the entire content of both of which is incorporated herein by reference.

BACKGROUND

1. Field

Aspects of one or more embodiments relate to a display panel and a display apparatus including the display panel.

2. Description of Related Art

Display apparatuses have been used for various purposes. In addition, with the advancement of technology, because the thickness and weight of display apparatuses has been reduced, the ranges of potential uses of display apparatuses has increased.

According to the use of display apparatuses, different methods of designing shapes thereof have been developed and more functions have been embedded in or linked to the display apparatuses.

The above information disclosed in this Background section is only for enhancement of understanding of the background and therefore the information discussed in this Background section does not necessarily constitute prior art.

SUMMARY

Aspects of one or more embodiments relate to a display panel and a display apparatus including the display panel, and for example, to a display panel having an expanded display area so as to display images in a region where a component, that is, an electronic element, is located, and a display apparatus including the display panel.

Aspects of one or more embodiments may include a display panel having an expanded display area so as to display images on a region where a component, that is, an electronic element, is provided, and a display apparatus including the display panel. However, the above technical characteristics are merely examples, and the scope of embodiments according to the present disclosure is not limited thereto.

Additional aspects will be set forth in part in the description which follows and, in part, will be apparent from the description, or may be learned by practice of the presented example embodiments of the disclosure.

According to some embodiments, a display panel including a main display area, a component area, and a peripheral area, the display panel includes a substrate, a main sub-pixel and a main pixel circuit, the main sub-pixel being in the main display area on the substrate and the main pixel circuit being connected to the main sub-pixel, a plurality of auxiliary sub-pixels in the component area on the substrate, a plurality of auxiliary pixel circuits in the peripheral area on the substrate, a plurality of connecting lines connecting the plurality of auxiliary sub-pixels to the plurality of auxiliary pixel circuits, respectively, and a dummy line extending in a direction in which the plurality of connecting lines extend in the component area.

According to some embodiments, the dummy line may be provided integrally with one of the plurality of connecting lines.

According to some embodiments, the plurality of connecting lines may include a plurality of first connecting lines and a plurality of second connecting lines, the plurality of first connecting lines and the plurality of second connecting lines may be at different layers from each other, and at least one of the plurality of first connecting lines may be between two adjacent second connecting lines from among the plurality of second connecting lines.

According to some embodiments, the plurality of first connecting lines may at least partially overlap the plurality of second connecting lines.

According to some embodiments, the main sub-pixel and the auxiliary sub-pixel may emit light of a same color, and the auxiliary sub-pixel may have a size greater than a size of the main sub-pixel.

According to some embodiments, the display panel may further include additional connecting lines for connecting the connecting lines to the auxiliary pixel circuits, wherein the additional connecting lines may include a material different from a material in the connecting line.

According to some embodiments, the connecting line and the dummy line may include a transparent conductive material.

According to some embodiments, a display panel includes a main display area, a component area, and a peripheral area, the display panel includes a substrate, a main sub-pixel and a main pixel circuit, the main sub-pixel being in the main display area on the substrate and the main pixel circuit being connected to the main sub-pixel, a plurality of auxiliary sub-pixels in the component area on the substrate, a plurality of auxiliary pixel circuits in the peripheral area on the substrate, and a plurality of connecting lines connecting the plurality of auxiliary sub-pixels to the plurality of auxiliary pixel circuits, respectively, wherein the plurality of connecting lines include a first connecting line and a second connecting line adjacent to each other, and include portions having different intervals from each other between centers of the first connecting line and the second connecting line in the component area.

According to some embodiments, the first connecting line may have a first width and a second width that are different from each other.

According to some embodiments, the first connecting line and the second connecting line may each include a bent portion.

According to some embodiments, the first connecting line and the second connecting line are each provided in plurality as a plurality of first connecting lines and a plurality of second connecting lines, respectively, the plurality of first connecting lines may be at a different layer from the plurality of second connecting lines, and at least one of the plurality of first connecting lines may be between two adjacent second connecting lines from among the plurality of second connecting lines.

According to some embodiments, the plurality of first connecting lines may at least partially overlap the plurality of second connecting lines.

According to some embodiments, the main sub-pixel and the auxiliary sub-pixel may emit light of a same color, and the auxiliary sub-pixel may have a size greater than a size of the main sub-pixel.

According to some embodiments, the display panel may further include an additional connecting line for connecting the connecting line to the auxiliary pixel circuit, wherein the additional connecting line may include a material different from a material in the connecting line.

According to some embodiments, a display apparatus includes a display panel including a main display area including main sub-pixels, a component area including auxiliary sub-pixels, and a peripheral area, and a component under the display panel to correspond to the component area, wherein the display panel includes a substrate, a main sub-pixel and a main pixel circuit, the main sub-pixel being in the main display area on the substrate and the main pixel circuit being connected to the main sub-pixel, a plurality of auxiliary sub-pixels in the component area on the substrate, a plurality of auxiliary pixel circuits in the peripheral area on the substrate, a plurality of connecting lines connecting the plurality of auxiliary sub-pixels to the plurality of auxiliary pixel circuits, respectively, and a dummy line extending in a direction in which the plurality of connecting lines extend in the component area.

According to some embodiments, the dummy line may be provided integrally with one of the plurality of connecting lines.

According to some embodiments, the main sub-pixel and the auxiliary sub-pixel may emit light of a same color, and the auxiliary sub-pixel may have a size greater than a size of the main sub-pixel.

According to some embodiments, the display apparatus may further include a plurality of additional connecting lines for connecting the plurality of connecting lines to the plurality of auxiliary pixel circuits respectively, wherein the plurality of additional connecting lines may include a material different from a material in the plurality of connecting lines.

According to some embodiments, the plurality of connecting lines include a first connecting line and a second connecting line adjacent to each other, and include portions having a different intervals from each other between centers of the first connecting line and the second connecting line in the component area.

According to some embodiments, the first connecting line may have a first width and a second width that are different from each other.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
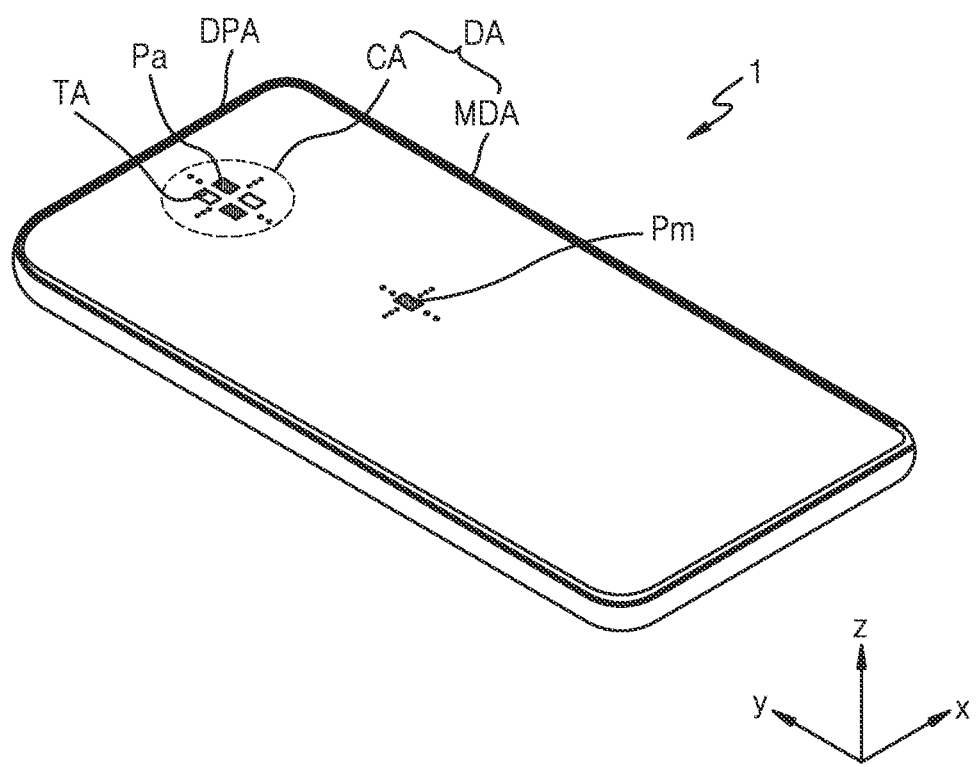
FIG. 1 is a perspective view of a display apparatus according to some embodiments.

Reference will now be made in more detail to aspects of some example embodiments, which are illustrated in the accompanying drawings, wherein like reference numerals refer to like elements throughout. In this regard, embodiments according to the present disclosure may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in more detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

Aspects of some embodiments will be described below in more detail with reference to the accompanying drawings. Those components that are the same or are in correspondence are rendered the same reference numeral regardless of the figure number, and redundant explanations are omitted.

It will be understood that when an element such as a layer, film, region or substrate is referred to as being placed "on" another element, it can be directly placed on the other element, or an intervening layer(s) may also be present. Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display apparatus 1 according to some embodiments of the present disclosure.

Referring to FIG. 1, the display apparatus 1 includes a display area DA and a peripheral area DPA on an outer portion (e.g., in a periphery, or outside a footprint) of the display area DA. The display area DA may include a component area CA and a main display area MDA at least partially surrounding the component area CA. That is, the component area CA and the main display area MDA may separately or together display an image. For example, in some instances, the component area CA and the main display area MDA may collectively display the entirety of an image, where the component area CA displays a first portion of the image, and the main display area MDA displays a second portion of the image, but together the first and second portions of the image form the entire image. Alternatively, in some instances, the component area CA may display a separate and distinct image from an image displayed in the main display area MDA. The peripheral area DPA may be a non-display area on which pixels are not arranged (e.g., a bezel area). The display area DA may be entirely surrounded by the peripheral area DPA.

In FIG. 1, one component area CA is in the main display area MDA. According to some embodiments, the display apparatus 1 may include two or more component areas CA, and shapes and sizes of the plurality of component areas CA may be different from one another. When seen from a direction perpendicular to an upper surface of the display apparatus 1, the component area CA may have various shapes, e.g., a circular shape, an elliptical shape, a polygonal shape such as a square shape, a start shape, a diamond shape, etc., but the shape of the component area CA is not limited to the shapes listed above, and may include any suitable shape according to the design of the display apparatus 1. In addition, in FIG. 1, the component area CA is illustrated as being located at an upper center (in a +y direction) of the main display area MDA that has a rectangular shape when seen from the direction perpendicular to the upper surface of the display apparatus 1, but the location of the component area CA is not limited thereto, and the component area CA may be at a side, e.g., an upper right side or an upper left side, of the main display area MDA having the rectangular shape, or any other suitable location according to the design of the display apparatus 1. Additionally, according to some embodiments, the display apparatus 1 may include a plurality of component areas CA.

The display apparatus 1 may display images by using a plurality of main sub-pixels Pm in the main display area MDA and a plurality of auxiliary sub-pixels Pa in the component area CA.

As described in more detail later with reference to FIG. 2, a component 40, that is, an electronic element, may be under the display panel to correspond to the component area CA. The electronic element or component 40 may include a sensor or emitter configured to receive or emit signals (e.g., light, radio waves, or other wireless spectrum signals) to/from an external device or environment. For example, the component 40 may include a camera using an infrared spectrum or a visible spectrum, and may include an imaging device. Alternatively, the component 40 may include a solar battery, a flash, an illuminance sensor, a proximity sensor, or an iris sensor. Alternatively, the component 40 may have a function of receiving sound. In order to reduce restriction in functions of the component 40, the component area CA may include a transmission area TA through which light and/or sound output from the component 40 to the outside or proceeding from the outside toward the component 40 may pass. In the display panel or the display apparatus including the display panel according to some embodiments, when the light passes through the component area CA, a light transmittance may be about 10% or greater, for example, 40% or greater, 25% or greater, 50% or greater, 85% or greater, or 90% or greater.

The plurality of auxiliary sub-pixels Pa may be in the component area CA. The plurality of auxiliary sub-pixels Pa emit light to provide a certain image. An image displayed on the component area CA is an auxiliary image, and may have a lower resolution than that of the image displayed on the main display area MDA. That is, the component area CA may include the transmission area TA through which the light and sound may transmit, and when there is no sub-pixel in the transmission area TA, the number of auxiliary sub-pixels Pa per unit area may be less than the number of main sub-pixels Pm per unit area in the main display area MDA.

Figure 2A:
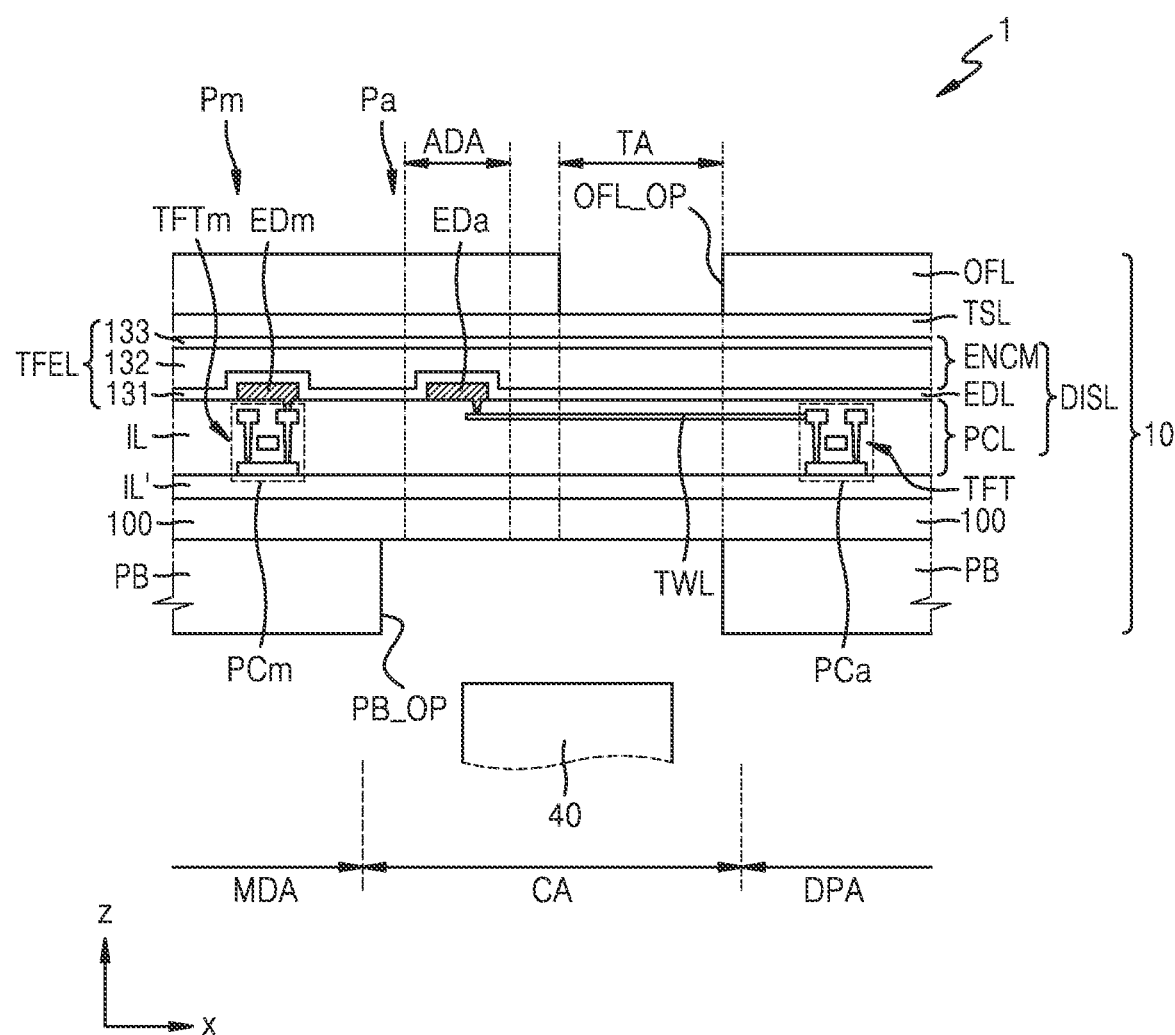
FIG. 2A is a cross-sectional view partially showing a display apparatus according to some embodiments.
Figure 2B:
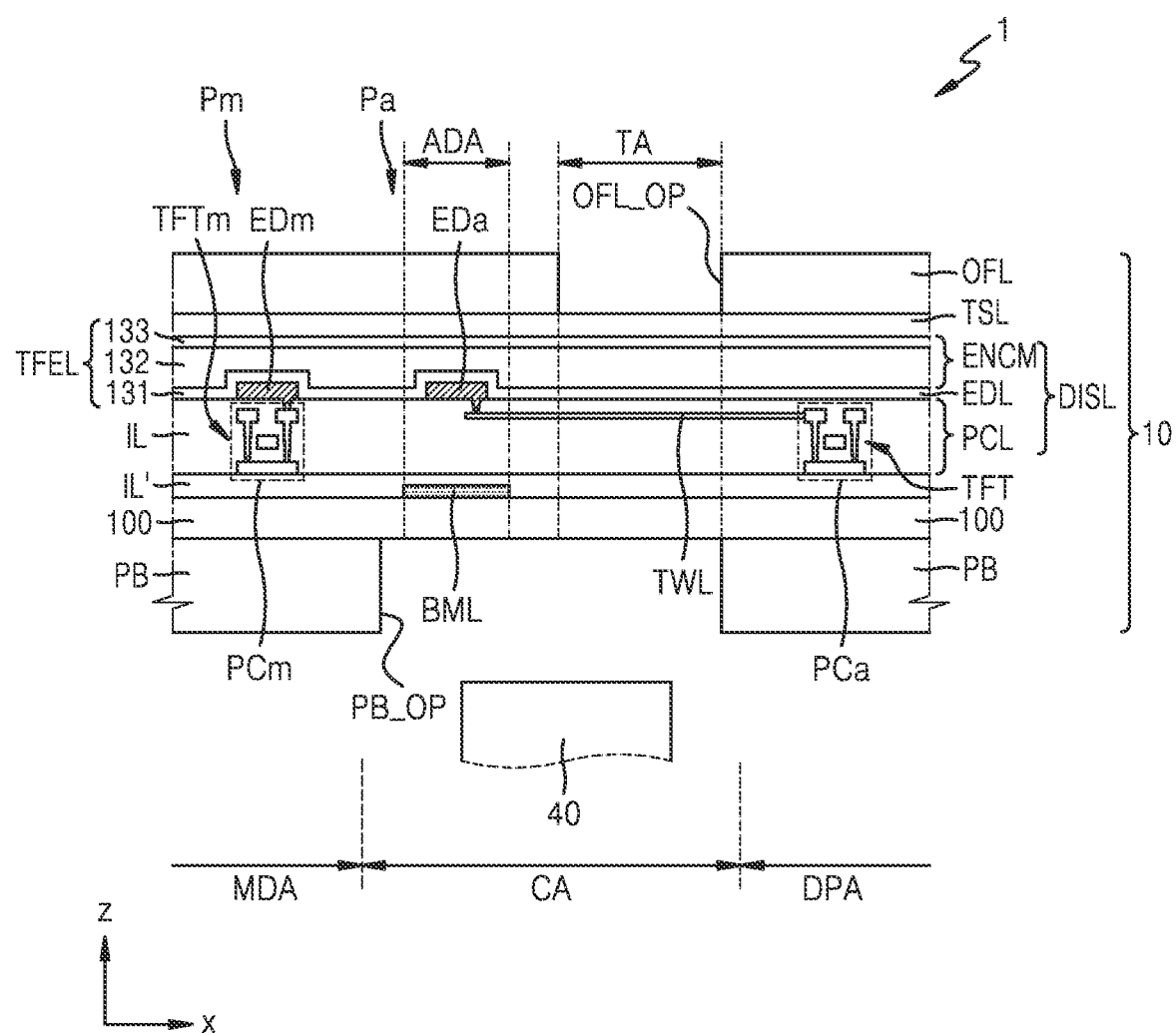
FIG. 2B is a cross-sectional view partially showing a display apparatus according to some embodiments.

FIGS. 2A and 2B are cross-sectional views partially showing the display apparatus 1 according to one or more embodiments.

Referring to FIG. 2A, the display apparatus 1 may include a display panel 10 and the component 40 overlapping the display panel 10. A cover window for protecting the display panel 10 may be further above the display panel 10.

The display panel 10 includes the component area CA that is a region overlapping the component 40 and the main display area MDA displaying main images. The display panel 10 may include a substrate 100, a display layer DISL on the substrate 100, a touch screen layer TSL, an optical functional layer OFL, and a panel protective member PB under the substrate 100.

The display layer DISL may include a circuit layer PCL including thin film transistors TFTm and TFTa, a display element layer including light-emitting elements EDm and EDa that are display elements, and an encapsulation member ENCM such as a thin film encapsulation layer TFEL or a sealing substrate. Insulating layers IL and IL' may be between the substrate 100 and the display layer DISL, and in the display layer DISL.

The substrate 100 may include an insulating material, such as glass, quartz, and polymer resin. The substrate 100 may include a rigid substrate or a flexible substrate that may be bendable, foldable, and rollable.

A main pixel circuit PCm and a main light-emitting element ED EDm connected to the main pixel circuit PCm may be in the main display area MDA of the display panel 10. The main pixel circuit PCm includes at least one thin film transistor TFTm and may control light emission from the main light-emitting element EDm. The main sub-pixel Pm may be implemented by light emission of the main light-emitting element EDm.

The auxiliary light-emitting element EDa is in the component area CA of the display panel 10 to implement the auxiliary sub-pixel Pa. According to some embodiments, the auxiliary pixel circuit PCa driving the auxiliary light-emitting element EDa may not be in the component area CA, but in the peripheral area DPA that is a non-display area. According to some embodiments, the auxiliary pixel circuit PCa may be partially in the main display area MDA or may be between the main display area MDA and the component area CA. That is, the auxiliary pixel circuit PCa may be provided not to overlap the auxiliary light-emitting element EDa.

The auxiliary pixel circuit PCa may include at least one thin film transistor TFTa and may be electrically connected to the auxiliary light-emitting element EDa via a connecting line TWL. The connecting line TWL may include a transparent conductive material. The auxiliary pixel circuit PCa may control the light emission from the auxiliary light-emitting element EDa. The auxiliary sub-pixel Pa may be implemented by the light emission from the auxiliary light-emitting element EDa. In the component area CA, a region where the auxiliary light-emitting element EDa is provided may be referred to as an auxiliary display area ADA.

Also, in the component area CA, a region where the auxiliary light-emitting element EDa that is a display element is not provided may be referred to as a transmission area TA. The transmission area TA may be a region through which light/signals emitted from the component 40 or light/signals incident in the component 40 that corresponds to the component area CA may transmit. The auxiliary display area ADA and the transmission area TA may be alternately arranged in the component area CA. The connecting line TWL connecting the auxiliary pixel circuit PCa and the auxiliary light-emitting element EDa may be in the transmission area TA. The connecting line TWL may include a transparent conductive material having a relatively high transmittance, and thus, even when the connecting line TWL is in the transmission area TA, the transmittance of the transmission area TA may be secured.

According to some embodiments, because the auxiliary pixel circuit PCa is not in the component area CA, an area of the transmission area TA may be ensured and the light transmittance may be further improved.

The display element layer EDL may be covered by the thin film encapsulation layer TFEL or by an encapsulation substrate. In one or more embodiments, the thin film encapsulation layer TFEL may include at least one inorganic encapsulation layer and at least one organic encapsulation layer as shown in FIG. 2. According to some embodiments, the thin film encapsulation layer TFEL may include first and second inorganic encapsulation layers 131 and 132 and an organic encapsulation layer 132 between the first and second inorganic encapsulation layers 131 and 133.

The first and second inorganic encapsulation layers 131 and 133 may each include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$), and may be formed by a chemical vapor deposition (CVD) method, etc. The organic encapsulation layer 132 may include a polymer-based material. The polymer-based material may include a silicon-based resin, an acryl-based resin, an epoxy-based resin, polyimide, polyethylene, etc.

The first inorganic encapsulation layer 131, the organic encapsulation layer 132, and the second inorganic encapsulation layer 133 may be integrally provided to cover the main display area MDA and the component area CA.

When the display element layer EDL is sealed by the encapsulation substrate, the encapsulation substrate may face the substrate 100 with the display element layer EDL therebetween. There may be a gap between the encapsulation substrate and the display element layer EDL. The encapsulation substrate may include glass. A sealant including frit, etc. may be between the substrate 100 and the encapsulation substrate, and the sealant may be in the peripheral area DPA. The sealant in the peripheral area DPA may surround the display area DA to prevent or reduce instances of moisture or other contaminants infiltrating through the side surfaces.

The touch screen layer TSL may obtain coordinate information according to an external input, e.g., a touch event. The touch screen layer TSL may include a touch electrode and touch lines connected to the touch electrode. The touch screen layer TSL may sense an external input according to a self-capacitance method or a mutual capacitance method.

The touch screen layer TSL may be on the thin film encapsulation layer TFEL. Alternatively, the touch screen layer TSL may be separately formed on a touch substrate, and then may be coupled onto the thin film encapsulation layer TFEL via an adhesive layer such as an optical clear adhesive (OCA). According to some embodiments, the touch screen layer TSL may be directly on the thin film encapsulation layer TFEL, and in this case, the adhesive layer may not be provided between the touch screen layer TSL and the thin film encapsulation layer TFEL.

The optical functional layer OFL may include an anti-reflection layer. The anti-reflection layer may reduce a reflectivity of light (external light) incident into the display apparatus 1 from the outside.

In some embodiments, the optical functional layer OFL may include a polarization film. The optical functional layer OFL may include an opening OFL_OP corresponding to the transmission area TA. Accordingly, the light transmittance of the transmission area TA may be noticeably improved. A transparent material such as optically clear resin (OCR) may be filled in the opening OFL_OP.

In some embodiments, the optical functional layer OFL may include a filter plate including a black matrix and color filters.

The panel protective member PB is attached to a lower portion of the substrate 100 in order to support and protect the substrate 100. The panel protective member PB may include an opening PB_OP corresponding to the component area CA. When the panel protective member PB includes the opening PB_OP, the light transmittance of the component area CA may be improved. The panel protective member PB may include polyethylene terephthalate (PET) or polyimide (PI).

An area of the component area CA may be greater than an area of a region in which the component 40 is arranged. Accordingly, an area of the opening PB_OP in the panel protective member PB may not be equal to that of the component area CA.

Also, a plurality of components 40 may be in the component area CA. The plurality of components 40 may have different functions from one another. For example, the plurality of components 40 may include at least two from among a camera (imaging device), a solar battery, a flash or light, a proximity sensor, an illuminance sensor, and an iris sensor.

In FIG. 2A, a bottom metal layer BML is not under the auxiliary light-emitting element EDa of the component area CA, but as shown in FIG. 2B, the display apparatus 1 according to the embodiment may include the bottom metal layer BML.

The bottom metal layer BML may be between the substrate 100 and the auxiliary light-emitting element EDa to overlap the auxiliary light-emitting element EDa. The bottom metal layer BML may block the external light from reaching the auxiliary light-emitting element EDa. In addition, the bottom metal layer BML may entirely correspond to the component area CA, and may include a lower hole corresponding to the transmission area TA. In this case, the lower hole may be provided in various shapes, e.g., a polygonal shape, a circular shape, or a non-defined shape, so as to adjust a refractive characteristic of the external light.

Figure 3A:
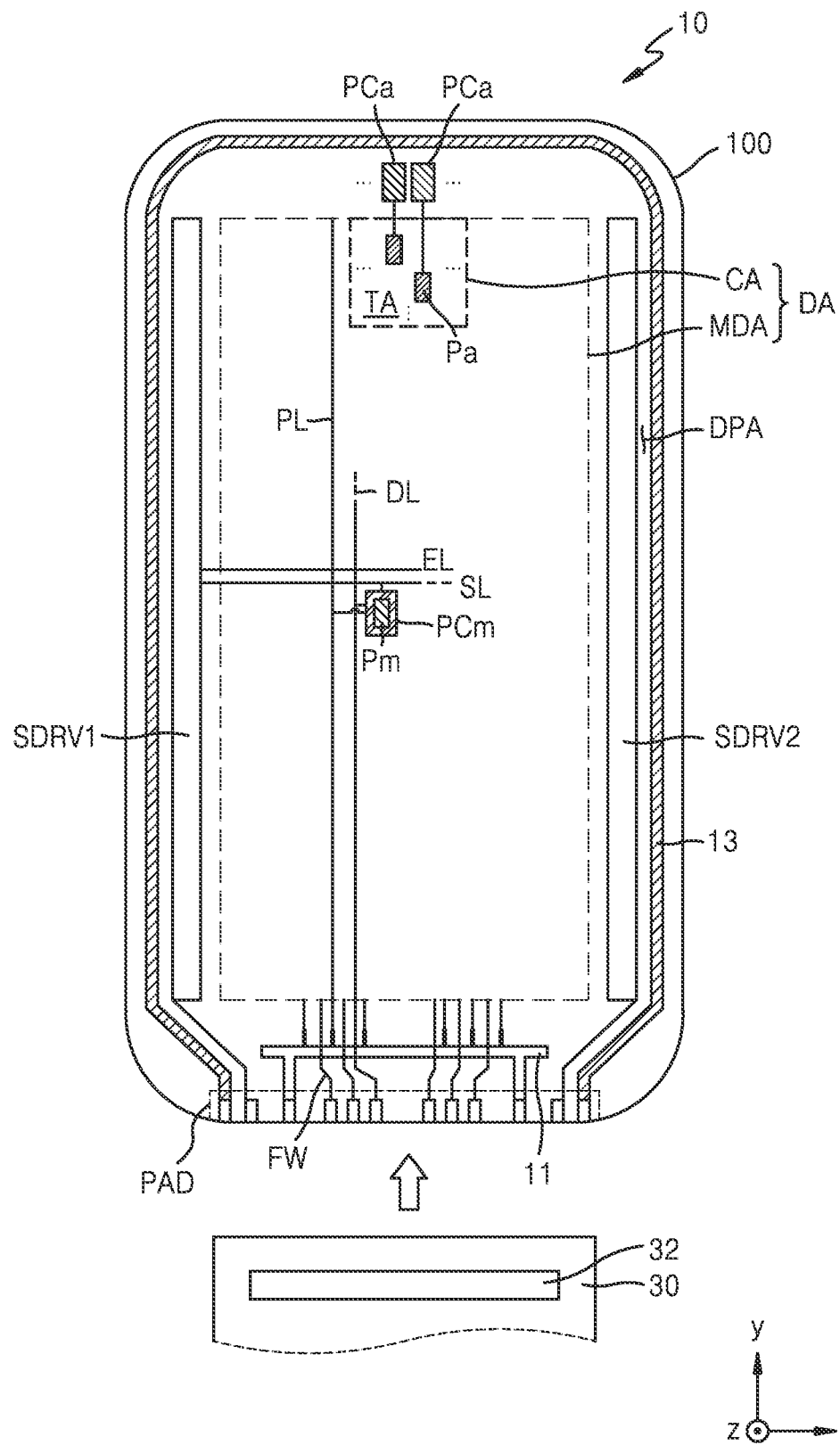
FIGS. 3A and 3B are plan views of a display panel that may be included in the display apparatus of FIG. 1.
Figure 3B:
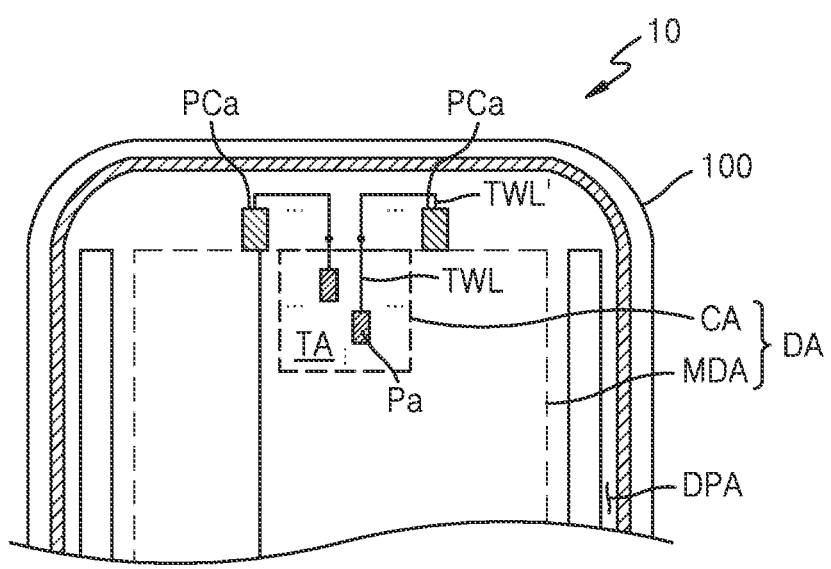

FIGS. 3A and 3B are plan views of a display panel 10 that may be included in the display apparatus 1 of FIG. 1.

Referring to FIG. 3A, various elements of the display panel 10 are on the substrate 100. The substrate 100 includes the display area DA and the peripheral area DPA surrounding the display area DA. The display area DA includes the main display area MDA displaying a main image, and the component area CA having the transmission area TA and displaying an auxiliary image. The auxiliary image may form one total image with a main image or may be an image independent from the main image.

A plurality of main sub-pixels Pm are arranged in the main display area MDA. Each of the plurality of main sub-pixels Pm may be implemented as a display element, such as an organic light-emitting diode OLED. The main pixel circuit PCm driving the main sub-pixel Pm is in the main display area MDA, and the main pixel circuit PCm may overlap the main sub-pixel Pm. Each of the main sub-pixels Pm may emit, for example, red light, green light, blue light, or white light. The main display area MDA is covered by an encapsulation member to be protected from external air or moisture.

The component area CA may be at a side of the main display area MDA as described above, or may be in the display area DA to be surrounded by the main display area MDA. A plurality of auxiliary sub-pixels Pa are arranged in the component area CA. Each of the auxiliary sub-pixels Pa may include a display element such as an organic light-emitting diode. The auxiliary pixel circuit PCa driving the auxiliary sub-pixel Pa may be in the peripheral area DPA that is adjacent to the component area CA. For example, when the component area CA is on an upper side of the display area DA, the auxiliary pixel circuit PCa may be on the upper side of the peripheral area DPA. The display elements included in the auxiliary pixel circuit PCa and the auxiliary sub-pixel Pa may be connected to each other via the connecting line TWL extending in the y-direction.

Each of the auxiliary sub-pixels Pa may emit, for example, red light, green light, blue light, or white light. The component area CA is covered by an encapsulation member to be protected from external air or moisture.

In addition, the component area CA may include the transmission area TA. The transmission area TA may surround the plurality of auxiliary sub-pixels Pa. Alternatively, the transmission area TA may be arranged as gratings with the plurality of auxiliary sub-pixels Pa.

Because the component area CA has the transmission area TA, a resolution of the component area CA may be less than that of the main display area MDA. For example, the resolution of the component area CA may be about ½, ⅜, ⅓, ¼, 2/9, ⅛, 1/9, 1/16, etc. of the resolution of the main display area MDA. For example, the main display area MDA may have a resolution of about 400 ppi, and the component area CA may have a resolution of about 200 ppi or about 100 ppi.

Each of the pixel circuits driving the sub-pixels Pm and Pa may be electrically connected to external circuits in the peripheral area DPA. A first scan driving circuit SDRV1, a second scan driving circuit SDRV2, a terminal portion PAD, a driving voltage supply line 11, and a common voltage supply line 13 may be in the peripheral area DPA.

The first scan driving circuit SDRV1 may apply a scan signal to each of the main pixel circuits PCm that drive the main sub-pixels Pm via a main scan line SLm. The first scan driving circuit SDRV1 may apply an emission control signal to each of the main pixel circuits PCm via a main emission control line ELm. The second scan driving circuit SDRV2 may be opposite to the first scan driving circuit SDRV1 based on the main display area MDA, and may be in parallel with the first scan driving circuit SDRV1. Some of the pixel circuits of the main sub-pixels Pm in the main display area MDA may be electrically connected to the first scan driving circuit SDRV1, and the other pixel circuits may be electrically connected to the second scan driving circuit SDRV2.

The terminal portion PAD may be at a side of the substrate 100. The terminal portion PAD may not be covered by the insulating layer, but may be exposed to be connected to a display circuit board 30. A display driver 32 may be on the display circuit board 30.

The display driver 32 may generate control signals that are to be transferred to the first scan driving circuit SDRV1 and the second scan driving circuit SDRV2. The display driver 32 may generate a data signal, and the data signal may be transferred to the main pixel circuits PCm via a fan-out wire FW and a main data line DLm connected to the fan-out wire FW.

Also, the display driver 32 may supply a driving voltage ELVDD to the driving voltage supply line 11 and may supply a common voltage ELVSS to the common voltage supply line 13. The driving voltage ELVDD may be applied to pixel circuits of the main and auxiliary sub-pixels Pm and Pa via the driving voltage line PL connected to the driving voltage supply line 11, and the common voltage ELVSS may be applied to an opposite electrode of the display element via the common voltage supply line 13.

The driving voltage supply line 11 may extend in the x-direction under the main display area MDA. The common voltage supply line 13 may have a loop shape having one open side to partially surround the main display area MDA.

FIG. 3A shows one component area CA, but a plurality of component areas CA may be provided. In this case, the plurality of component areas CA are separated from one another, and a first camera may correspond to one component area CA and a second camera may correspond to another component area CA. Alternatively, a camera may correspond to one component area CA and an infrared ray sensor may correspond to another component area CA. Shapes and sizes of the plurality of component areas CA may be different from one another.

In addition, the component area CA may have a circular shape, an elliptical shape, a polygonal shape, or a non-defined shape. In some embodiments, the component area CA may have an octagonal shape. The component area CA may have various polygonal shapes, e.g., a rectangular shape, a hexagonal shape, etc. The component area CA may be surrounded by the main display area MDA.

Also, in FIG. 3A, the auxiliary pixel circuit PCa is arranged adjacent to an outer side of the component area CA, but embodiments according to the present disclosure are not limited thereto. As shown in FIG. 3B, the auxiliary pixel circuit PCa may be arranged adjacent to an outer side of the main display area MDA. In some embodiments, the connecting line TWL may be connected to the auxiliary pixel circuit PCa via an additional connecting line TWL'. In this case, the connecting line TWL may be in the component area CA, and the additional connecting line TWL' may be in the peripheral area DPA. The connecting line TWL may include a transparent conductive material, and the additional connecting line TWL' may include highly conductive metal. In some embodiments, the additional connecting line TWL' may be at the same layer as that of the connecting line TWL. According to some embodiments, the additional connecting line TWL' may be at a different layer from that of the connecting line TWL and may be connected to the connecting line TWL via a contact hole.

Figure 4A:
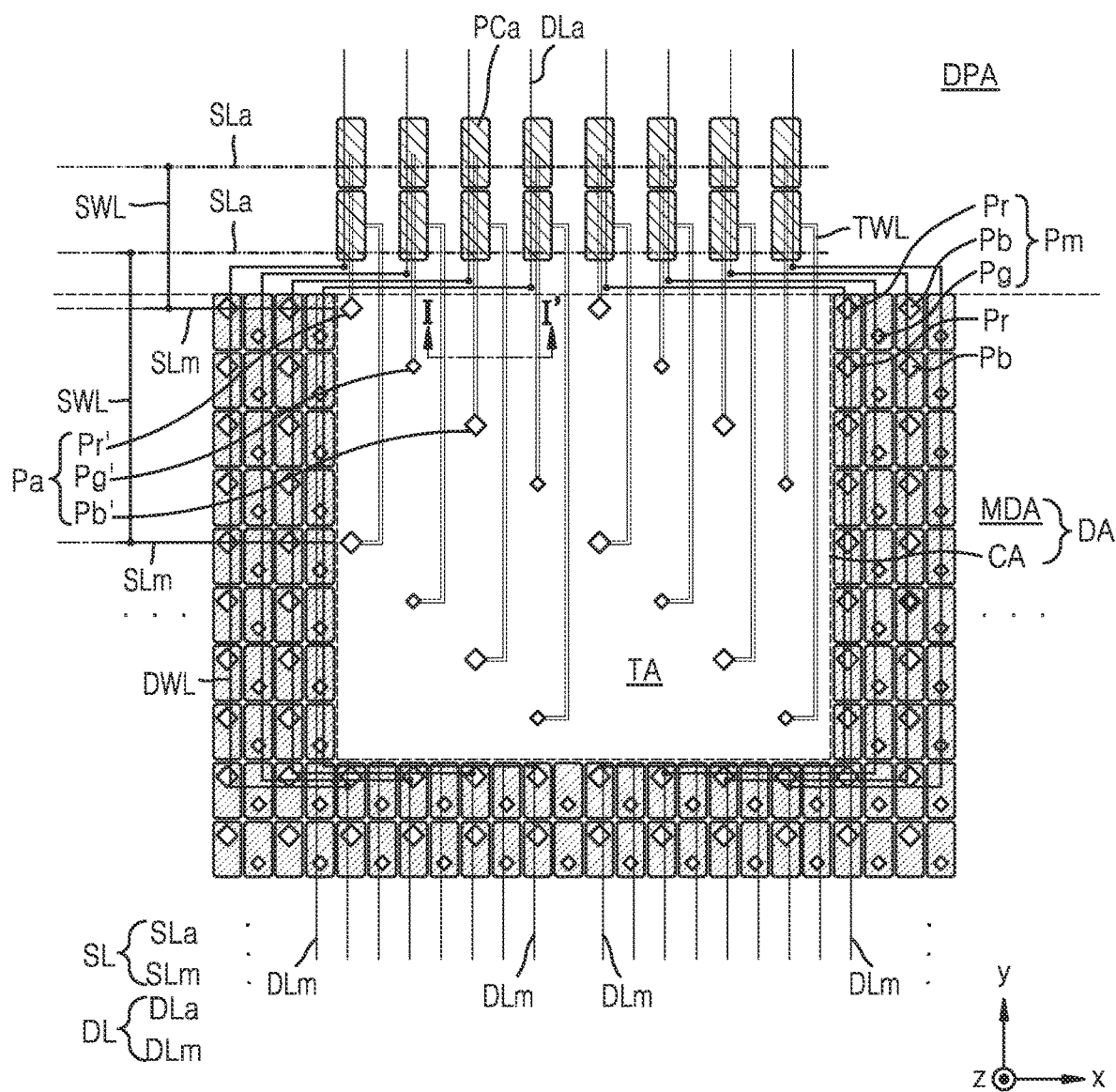
FIGS. 4A and 4B are a plan layout showing a partial area of a display panel according to some embodiments.
Figure 4B:
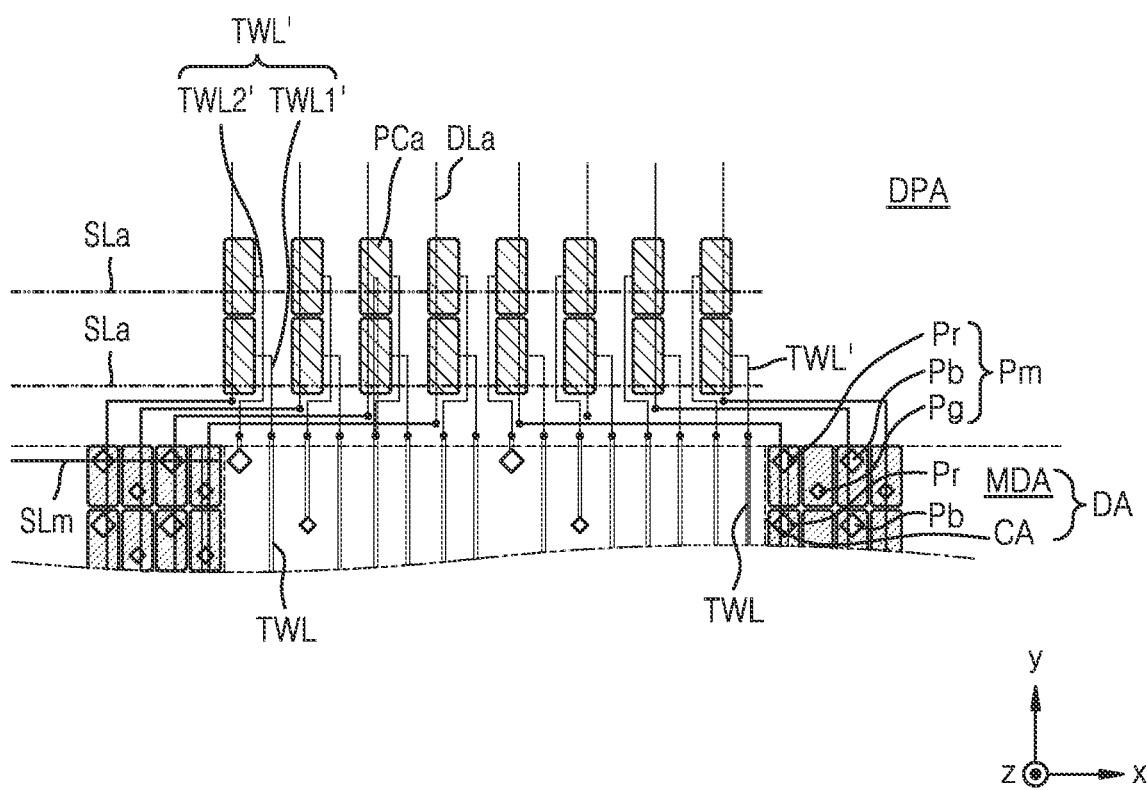

FIGS. 4A and 4B are planar layouts showing some regions in the display panel 10 according to one or more embodiments. For example, FIGS. 4A and 4B each show the component area CA, the main display area MDA around the component area CA, and a part of the peripheral area DPA.

Referring to FIG. 4A, a plurality of main sub-pixels Pm may be in the main display area MDA. In the specification, the sub-pixel is a minimum unit for realizing or generating an image, and denotes a light-emitting region from which light is emitted by a display element. When an organic light-emitting diode is used as a display element, the light-emitting region may be defined by the opening of a pixel defining layer. This will be described in more detail later. Each of the plurality of main sub-pixels Pm may emit one of red light, green light, blue light, and white light.

In some embodiments, the main sub-pixels Pm in the main display area MDA may include a first sub-pixel Pr, a second sub-pixel Pg, and a third sub-pixel Pb. The first sub-pixel Pr, the second sub-pixel Pg, and the third sub-pixel Pb may respectively emit red light, green light, and blue light. The main sub-pixels Pm may be arranged in a Pentile structure.

For example, from among vertices of a virtual square having a central point of the second sub-pixel Pg as a central point of the square, the first sub-pixel Pr is at first and third vertices and the third sub-pixel Pb may be at second and fourth vertices. A size of the second sub-pixel Pg may be less than those of the first sub-pixel Pr and the third sub-pixel Pb.

This pixel arrangement structure is referred to as a Pentile™ matrix structure or a Pentile™ structure. By applying rendering, in which a color of a pixel is represented by sharing the colors of its adjacent pixels, a relatively high resolution may be obtained via a small number of pixels.

FIG. 4A shows that the plurality of main sub-pixels Pm are arranged in the Pentile™ matrix structure, but one or more embodiments are not limited thereto. For example, the plurality of main sub-pixels Pm may be arranged in various shapes, e.g., a stripe structure, a mosaic arrangement structure, a delta arrangement structure, etc.

In the main display area MDA, the main pixel circuits PCm may overlap the main sub-pixels Pm, and the main pixel circuits PCm may be arranged in the form of a matrix in the x and y directions. In the specification, the main pixel circuit PCm denotes a unit of pixel circuit included in one main sub-pixel Pm.

A plurality of auxiliary sub-pixels Pa may be in the component area CA. Each of the plurality of main sub-pixels Pm may emit one of red light, green light, blue light, and white light. The auxiliary sub-pixels Pa may include a first sub-pixel Pr', a second sub-pixel Pg', and a third sub-pixel Pb'. The first sub-pixel Pr', the second sub-pixel Pg', and the third sub-pixel Pb' may emit red light, green light, and blue light.

The number of auxiliary sub-pixels Pa per unit area in the component area CA may be less than the number of main sub-pixels Pm per unit area in the main display area MDA. For example, the number of the auxiliary sub-pixels Pa and the number of main sub-pixels Pm in the same area may be in a ratio of 1:2, 1:4, 1:8, or 1:9. That is, a resolution of the component area CA may be ½, ¼, ⅛, or ⅑ of a resolution of the main display area MDA. FIG. 4A shows an example in which the component area CA has a resolution that is about ⅛ of the resolution of the main display area MDA.

The auxiliary sub-pixels Pa in the component area CA may be arranged as various shapes. Some of the auxiliary sub-pixels Pa may be grouped as a pixel group, and in the pixel group, the auxiliary sub-pixels Pa may be arranged as various shapes, e.g., a stripe structure, a mosaic arrangement structure, and a delta arrangement structure, etc. Here, a distance between the auxiliary sub-pixels Pa in the pixel group may be equal to a distance between the main sub-pixels Pm.

Alternatively, as shown in FIG. 4A, the auxiliary sub-pixels Pa may be distributed in the component area CA. That is, the distance between the auxiliary sub-pixels Pa may be greater than that between the main sub-pixels Pm. In addition, a region where the auxiliary sub-pixels Pa are not provided in the component area CA may be the transmission area TA having high light transmittance.

The auxiliary pixel circuits PCa realizing the light emission from the auxiliary sub-pixels Pa may be in the peripheral area DPA. Because the auxiliary pixel circuits PCa are not in the component area CA, the component area CA may have a relatively large transmission area TA. Also, lines applying a constant voltage and signals to the auxiliary pixel circuits PCa are not in the component area CA, and thus the auxiliary sub-pixels Pa may be freely arranged without considering the arrangement of the lines.

The auxiliary pixel circuits PCa may be connected to the auxiliary sub-pixels Pa via the connecting lines TWL. The connecting line TWL may include a transparent conductive material. For example, the connecting line TWL may include a transparent conducting oxide (TCO). The connecting line TWL may include a conductive oxide such as indium tin oxide (ITO), indium zinc oxide (IZO), zinc oxide (ZnO), indium oxide ($In_2O_3$), indium gallium oxide, or aluminum zinc oxide (AZO).

That the connecting line TWL is connected to the auxiliary sub-pixel Pa may denote that the connecting line TWL is electrically connected to the pixel electrode of the display element included in the auxiliary sub-pixel Pa.

The scan line SL may include a main scan line SLm connected to the main pixel circuits PCm and an auxiliary scan line SLa connected to the auxiliary pixel circuits PCa. The main scan line SLm extends in the x-direction to be connected to the main pixel circuits PCm on a same row. The main scan line SLm may not be in the component area CA. That is, the main scan line SLm may be disconnected at the component area CA. In this case, the main scan line SLm at a left side of the component area CA may receive a signal from the first scan driving circuit SDRV2 (see FIG. 3A), and the main scan line SLm at a right side of the component area CA may receive a signal from the first scan driving circuit SDRV1 (see FIG. 3A).

The auxiliary scan line SLa may be connected to the auxiliary pixel circuits PCa that drive the auxiliary sub-pixels Pa in the same row, from among the auxiliary pixel circuits PCa in the same row.

The main scan line SLm and the auxiliary scan line SLa are connected to a scan connecting line SWL, and thus, a same signal may be applied to the pixel circuits driving the main sub-pixel Pm and the auxiliary sub-pixel Pa in the same row.

The scan connecting line SWL may be at a different layer from the main scan line SLm and the auxiliary scan line SLa, and thus, the scan connecting line SWL may be connected to the main scan line SLm and the auxiliary scan line SLa respectively via contact holes. The scan connecting line SWL may be in the peripheral area DPA.

The data line DL may include a main data line DLm connected to the main pixel circuits PCm and an auxiliary data line DLa connected to the auxiliary pixel circuits PCa. The main data line DLm extends in the y-direction and may be connected to the main pixel circuits PCm in the same column. The auxiliary data line DLa extends in the y-direction and may be connected to the auxiliary pixel circuits PCa in the same column.

The main data line DLm and the auxiliary data line DLa may be separated from each other with the component area CA therebetween. The main data line DLm and the auxiliary data line DLa are connected to a data connecting line DWL, and thus, a same signal may be applied to the pixel circuits driving the main sub-pixel Pm and the auxiliary sub-pixel Pa in the same column.

The data connecting line DWL may bypass the component area CA. The data connecting line DWL may overlap the main pixel circuits PCm in the main display area MDA. Because the data connecting line DWL is in the main display area MDA, an additional space for arranging the data connecting line DWL may not be necessary, and thus, an area of a dead space may be reduced.

The data connecting line DWL may be at a different layer from the main data line DLm and the auxiliary data line DLa, and thus, the data connecting line DWL may be connected to the main data line DLm and the auxiliary data line DLa respectively via contact holes.

FIG. 4A shows that the connecting line TWL is integrally provided from the peripheral area DPA to the auxiliary sub-pixels Pa in the component area CA, but one or more embodiments are not limited thereto. As shown in FIG. 4B, the connecting line TWL may be connected to the auxiliary pixel circuits PCa via an additional connecting line TWL'.

The additional connecting line TWL' may be in the peripheral area DPA and connected to the auxiliary pixel circuit PCa. The additional connecting line TWL' may include a conductive material including molybdenum (Mo), aluminum (Al), copper (Cu), titanium (Ti), etc., and may have a single-layered or multi-layered structure. A plurality of additional connecting lines TWL' may be among the auxiliary pixel circuits PCa. In some embodiments, the additional connecting line TWL' may include a first additional connecting line TWL1' and a second additional connecting line TWL1' at different layers. For example, the first additional connecting line TWL1' may be at the same layer as the data line DL and may include the same material as that of the data line DL. The second additional connecting line TWL2' and the first additional connecting line TWL1' may be arranged with an insulating layer therebetween. For example, the second additional connecting line TWL2' may be at the same layer as a pixel electrode 121 (see FIG. 5) of the organic light-emitting diode OLED and may include the same material as that of the pixel electrode 121. Alternatively, the second additional connecting line TWL2' may be at the same layer as a connecting electrode CM (see FIG. 5) and may include the same material as that of the connecting electrode CM. The first additional connecting line TWL1' and the second additional connecting line TWL2' may be between the auxiliary pixel circuits PCa and at least partially curved on a plane. There may be a plurality of first additional connecting lines TWL1' and a plurality of second additional connecting lines TWL2' at different layers from each other, and the first additional connecting line TWL1' and the second additional connecting line TWL2' may be alternately arranged in a space between the plurality of auxiliary pixel circuits PCa.

The connecting line TWL may be in the component area CA and may be connected to the additional connecting line TWL' at an edge of the component area CA. The connecting line TWL may include a transparent conductive material. For example, the connecting line TWL may include a transparent conducting oxide (TCO). The connecting line TWL may include a conductive oxide such as indium tin oxide (ITO), indium zinc oxide (IZO), zinc oxide (ZnO), indium oxide (In$_2$O$_3$), indium gallium oxide, or aluminum zinc oxide (AZO).

The additional connecting line TWL' and the connecting line TWL may be at the same layer or different layers. When the additional connecting line TWL' and the connecting line TWL are at different layers from each other, the additional connecting line TWL' and the connecting line TWL may be connected to each other via a contact hole.

The additional connecting line TWL' may have a higher conductivity than that of the connecting line TWL. Because the additional connecting line TWL' is in the peripheral area DPA, there is no need to ensure light transmittance. Thus, the additional connecting line TWL' may include a material having lower light transmittance and higher conductivity than those of the connecting line TWL. Accordingly, a resistance of the connecting line TWL may be reduced.

Figure 5:
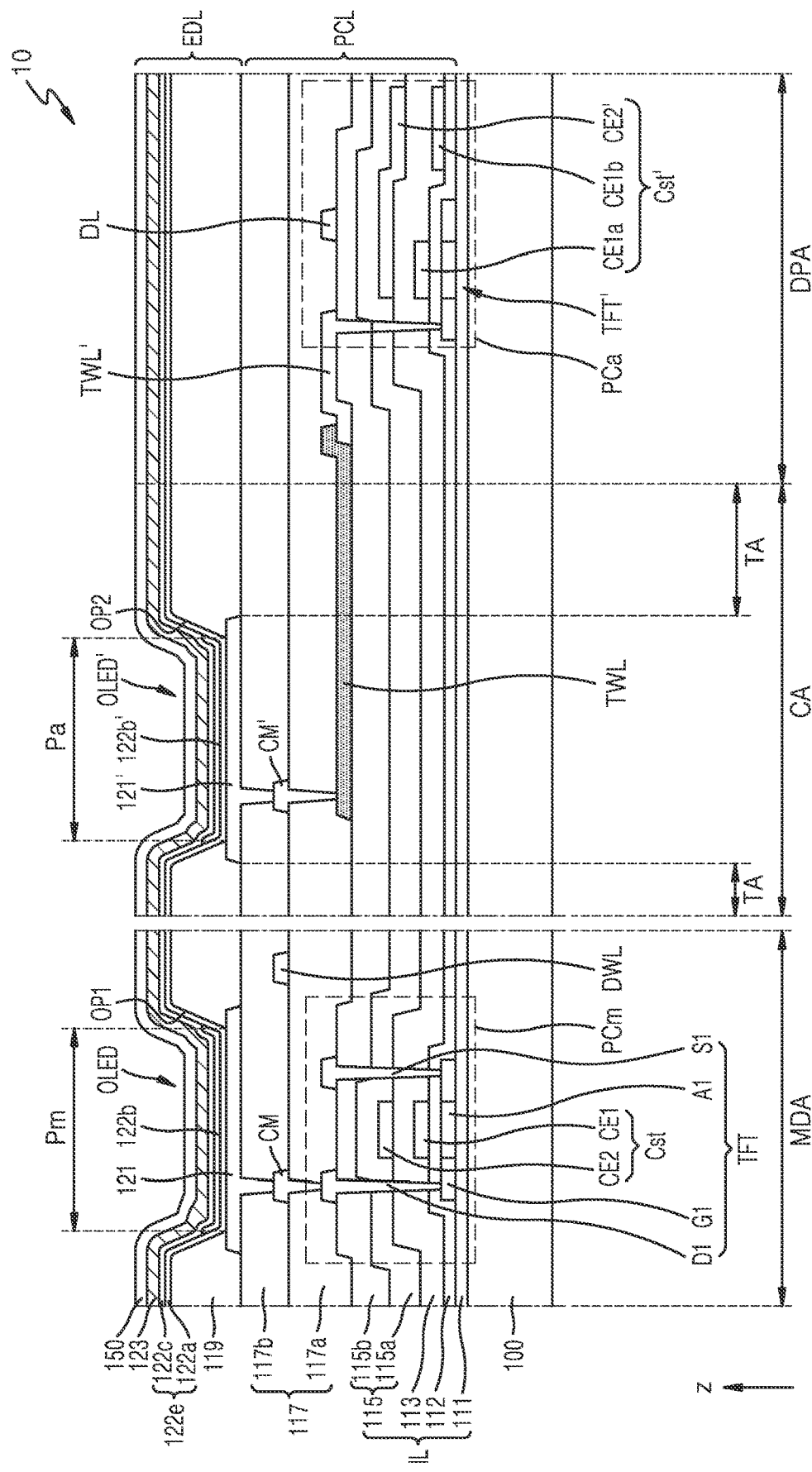
FIG. 5 is a cross-sectional view partially showing a display panel according to some embodiments.

FIG. 5 is a cross-sectional view showing a portion of the display panel 10 according to some embodiments, and partially shows the main display area MDA, the component area CA, and the peripheral area DPA.

Referring to FIG. 5, the main sub-pixels Pm are in the main display area MDA, and the component area CA includes the auxiliary sub-pixels Pa and the transmission area TA. The main pixel circuit PCm including the main thin film transistor TFT and the main storage capacitor Cst and the main organic light-emitting diode OLED that is a display element connected to the main pixel circuit PCm may be in the main display area MDA. The auxiliary organic light-emitting diode OLED' may be in the component area CA. The auxiliary pixel circuit PCa including an auxiliary thin film transistor TFT' and the auxiliary storage capacitor Cst' may be in the peripheral area DPA. In addition, the connecting line TWL for connecting the auxiliary pixel circuit PCa and the auxiliary organic light-emitting diode OLED' may be in the component area CA and the peripheral area DPA.

According to some embodiments, the organic light-emitting diode is adopted as the display element, but according to some embodiments, an inorganic light-emitting diode or a quantum dot light-emitting diode may be adopted as the display element.

Hereinafter, a structure in which the elements in the display panel 10 are stacked will be described below. The display panel 10 may include a substrate 100, a buffer layer 111, a circuit layer PCL, and a display element layer EDL that are stacked.

The substrate 100 may include an insulating material, such as glass, quartz, and polymer resin. The substrate 100 may include a rigid substrate or a flexible substrate that may be bendable, foldable, and rollable.

A buffer layer 111 is on the substrate 100 to reduce or block infiltration of impurities, moisture, or external air from a lower portion of the substrate 100, and to provide a flat surface on the substrate 100. The buffer layer 111 may include an inorganic material such as an oxide material or a nitride material, an organic material, or an inorganic-organic composite material, and may have a single-layered or multi-layered structure including the inorganic material and the organic material. A barrier layer for preventing or reducing infiltration of external air may be further provided between the substrate 100 and the buffer layer 111. In some embodiments, the buffer layer 111 may include silicon oxide (SiO2) or silicon nitride (SiNx).

The circuit layer PCL is on the buffer layer 111 and may include the main and auxiliary pixel circuits PCm and PCa, a first gate insulating layer 112, a second gate insulating layer 113, an interlayer insulating layer 115, and a planarization layer 117. The main pixel circuit PCm may include the main thin film transistor TFT and the main storage capacitor Cst, and the auxiliary pixel circuit PCa may include the auxiliary thin film transistor TFT' and the auxiliary storage capacitor Cst'.

The main thin film transistor TFT and the auxiliary thin film transistor TFT' may be on the buffer layer 111. The main thin film transistor TFT includes the first semiconductor layer A1, the first gate electrode G1, the first source electrode S1, and the first drain electrode D1. The main thin film transistor TFT is connected to a main organic light-emitting diode OLED and may drive the main organic light-emitting diode OLED. The auxiliary thin film transistor TFT' is connected to the auxiliary organic light-emitting diode OLED' and may drive the auxiliary organic light-emitting diode OLED'. The auxiliary thin film transistor TFT' has a similar configuration to that of the main thin film transistor TFT, and thus, descriptions about the main thin film transistor TFT will replace the description about the auxiliary thin film transistor TFT'.

The first semiconductor layer A1 is on the buffer layer 111, and may include polysilicon. According to some embodiments, the first semiconductor layer A1 may include amorphous silicon. According to some embodiments, the first semiconductor layer A1 may include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). The first semiconductor layer A1 may include a channel region, and a source region and a drain region doped with impurities.

The first gate insulating layer 112 may cover the first semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 112 may have a single-layered or a multi-layered structure including the inorganic insulating material.

The first gate electrode G1 is on the first gate insulating layer 112 to overlap the first semiconductor layer A1. The first gate electrode G1 may include molybdenum (Mo), aluminum (Al), copper (Cu), titanium (Ti), etc., and may have a single-layered or multi-layered structure. As an example, the first gate electrode G1 may have a single layer including Mo.

The second gate insulating layer 113 may cover the first gate electrode G1. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 113 may have a single-layered or a multi-layered structure including the inorganic insulating material.

An upper electrode CE2 of the main storage capacitor Cst and the upper electrode CE2' of the auxiliary storage capacitor Cst' may be on the second gate insulating layer 113.

In the main display area MDA, the upper electrode CE2 of the main storage capacitor Cst may overlap the first gate electrode G1 thereunder. The first gate electrode G1 and the upper electrode CE2 overlapping each other with the second gate insulating layer 113 therebetween may configure the main storage capacitor Cst. The first gate electrode G1 may be a lower electrode CE1 of the main storage capacitor Cst.

In the peripheral area DPA, the upper electrode CE2' of the auxiliary storage capacitor Cst' may overlap the gate electrode of the auxiliary thin film transistor TFT' thereunder. The gate electrode of the auxiliary thin film transistor TFT' may be the first lower electrode CE1a of the auxiliary storage capacitor Cst'. The auxiliary storage capacitor Cst' may further include the second lower electrode CE1b that is at the same layer as that of the first lower electrode CE1a. The upper electrode CE2' of the auxiliary storage capacitor Cst' may overlap the first lower electrode CE1a and the second lower electrode CE1b. The first lower electrode CE1a and the second lower electrode CE1b may be electrically connected to each other. According to the above configuration, a capacitance of the auxiliary storage capacitor Cst' may be greater than that of the main storage capacitor Cst.

The upper electrodes CE2 and CE2' may each include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) in a single-layered or multi-layered structure.

The interlayer insulating layer 115 may cover the upper electrodes CE2 and CE2'. The interlayer insulating layer 115 may include an insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide ($ZnO_2$). The interlayer insulating layer 115 may have a single-layered or a multi-layered structure including the inorganic insulating material. In some embodiments, the interlayer insulating layer 115 may include a first interlayer insulating layer 115a and a second interlayer insulating layer 115b stacked with each other. In this case, the first interlayer insulating layer 115a may include silicon oxide $SiO_x$ and the second interlayer insulating layer 115b may include silicon nitride $SiN_x$.

The source electrode S1 and the drain electrode D1 may be on the interlayer insulating layer 115. The source electrode S1 and the drain electrode D1 may include a conductive material including molybdenum (Mo), aluminum (Al), copper (Cu), titanium (Ti), etc., and may have a single-layered or multi-layered structure including the above materials. For example, the source electrode S1 and the drain electrode D1 may each have a multi-layered structure including Ti/Al/Ti.

The connecting line TWL connected to the auxiliary pixel circuit PCa may be on the interlayer insulating layer 115. The connecting line TWL extends from the peripheral area DPA to the component area CA and may connect the auxiliary organic light-emitting diode OLED' to the auxiliary pixel circuit PCa. The data line DL may be on the interlayer insulating layer 115.

The connecting line TWL may be connected to the additional connecting line TWL'. The additional connecting line TWL' is in the peripheral area DPA and may be connected to the auxiliary pixel circuit PCa, e.g., the auxiliary thin film transistor TFT'. The connecting line TWL may be in the transmission area TA of the component area CA. The connecting line TWL may be at the same layer as that of the additional connecting line TWL' and may include a different material from that of the additional connecting line TWL'. An end of the connecting line TWL may cover an end of the additional connecting line TWL'.

The additional connecting line TWL' may include a conductive material including molybdenum (Mo), aluminum (Al), copper (Cu), titanium (Ti), etc., and may have a single-layered or multi-layered structure. The additional connecting line TWL' may include the same material as that of the data line DL.

The connecting line TWL may include a transparent conductive material. For example, the connecting line TWL may include a transparent conducting oxide (TCO). The connecting line TWL may include a conductive oxide such as indium tin oxide (ITO), indium zinc oxide (IZO), zinc oxide (ZnO), indium oxide (In$_2$O$_3$), indium gallium oxide, or aluminum zinc oxide (AZO).

The additional connecting line TWL' may have a higher conductivity than that of the connecting line TWL. Because the additional connecting line TWL' is in the peripheral area DPA, there is no need to ensure light transmittance. Thus, the additional connecting line TWL' may include a material having lower light transmittance and higher conductivity than those of the connecting line TWL.

The planarization layer 117 may cover the source electrodes S1 and S2, the drain electrodes D1 and D2, and the connecting line TWL. The planarization layer 117 may have a flat upper surface so that a first pixel electrode 121 and a second pixel electrode 121' that will be arranged thereon may be planarized.

The planarization layer 117 may include an organic material or an inorganic material and may have a single-layered or multi-layered structure. The planarization layer 117 may include a first planarization layer 117a and a second planarization layer 117b. Accordingly, a conductive pattern such as a wiring may be provided between the first planarization layer 117a and the second planarization layer 117b, and high integration may be implemented. The connecting electrodes CM and CM' and the data connecting line DWL may be on the first planarization layer 117a.

The planarization layer 117 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, etc. The planarization layer 117 may include an inorganic insulating material such as silicon oxide (SiO$_2$), silicon nitride (SiN$_x$), silicon oxynitride (SiO$_x$N$_y$), aluminum oxide (Al$_2$O$_3$), titanium oxide (TiO$_2$), tantalum oxide (Ta$_2$O$_5$), hafnium oxide (HfO$_2$), and zinc oxide (ZnO$_2$). When the planarization layer 117 is formed, after arranging a layer, a chemical and mechanical polishing may be performed on an upper surface of the layer to provide a flat upper surface.

The first planarization layer 117a may cover the main and auxiliary pixel circuits PCm and PCa. The second planarization layer 117b is on the first planarization layer 117a and may have a flat upper surface such that the pixel electrodes 121 and 121' may be formed to be flat.

The main and auxiliary organic light-emitting diodes OLED and OLED' are on the second planarization layer 117b. The pixel electrodes 121 and 121' of the organic light-emitting diodes OLED and OLED' may be connected to the main and auxiliary pixel circuits PCm and PCa via the connecting electrodes CM and CM' on the first planarization layer 117a.

The first pixel electrode 121 and the second pixel electrode 121' may include a conductive oxide such as indium tin oxide (ITO), indium zinc oxide (IZO), zinc oxide (ZnO), indium oxide (In$_2$O$_3$), indium gallium oxide, or aluminum zinc oxide (AZO). The first and second pixel electrodes 121 and 121' may each include a reflective layer including argentum (Ag), magnesium (Mg), aluminum (Al), platinum (Pt), palladium (Pd), aurum (Au), nickel (Ni), neodymium (Nd), iridium (Ir), chrome (Cr), or a compound thereof. For example, the first and second pixel electrodes 121 and 121' may each have a structure in which films including ITO, IZO, ZnO, or In$_2$O$_3$ are on/under the above-mentioned reflective layer. In this case, the first and second pixel electrodes 121 and 121' may each have a stacked structure including ITO/Ag/ITO.

The pixel defining layer 119 is on the planarization layer 117 and covers edges of the first and second pixel electrodes 121 and 121', and may include a first opening OP1 and a second opening OP2 respectively exposing central portions of the first and second pixel electrodes 121 and 121'. Sizes and shapes of light-emitting regions, that is, sub-pixels Pm and Pa, in the organic light-emitting diodes OLED and OLED' are defined by the first opening OP1 and the second opening OP2.

The pixel defining layer 119 increases a distance between an edge of the first and second pixel electrodes 121 and 121' and an opposite electrode 123 on the pixel electrodes 121 and 121' to prevent or reduce generation of an arc at the edge of the pixel electrodes 121 and 121'. The pixel-defining layer 119 may include an organic insulating material such as polyimide, polyamide, acrylic resin, benzocyclobutene, hexamethyldisiloxane (HMDSO), and phenolic resin, and may be formed by spin coating.

A first emission layer 122b and a second emission layer 122b' respectively corresponding to the first pixel electrode 121 and the second pixel electrode 121' are in the first opening OP1 and the second opening OP2 of the pixel defining layer 119. The first emission layer 122b and the second emission layer 122b' may respectively include a polymer material or a low-molecular material, and may emit red light, green light, blue light, or white light.

An organic functional layer 122e may be on and/or under the first and second emission layers 122b and 122b'. The organic functional layer 122e may include a first functional layer 122a and/or a second functional layer 122c. The first functional layer 122a or the second functional layer 122c may be omitted.

The first functional layer 122a may be under the first emission layer 122b and the second emission layer 122b'. The first functional layer 122a may have a single-layered or multi-layered structure including an organic material. The first functional layer 122a may include a hole transport layer (HTL) having a single-layered structure. Alternatively, the first functional layer 122a may include a hole injection layer (HIL) and the HTL. The first functional layer 122a may be integrally provided to correspond to the organic light-emitting diodes OLED and OLED' in the main display area MDA and the component area CA.

The second functional layer 122c may be on the first emission layer 122b and the second emission layer 122b'. The second functional layer 122c may have a single-layered or multi-layered structure including an organic material. The second functional layer 122c may include an electron transport layer (ETL) and/or an electron injection layer (EIL). The second functional layer 122c may be integrally provided to correspond to the organic light-emitting diodes OLED and OLED' in the main display area MDA and the component area CA.

The opposite electrode 123 is on the second functional layer 122c. The opposite electrode 123 may include a conductive material having a low work function. For example, the opposite electrode 123 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the opposite electrode 123 may further include a layer including ITO, IZO, ZnO, or In$_2$O$_3$ on the (semi-)transparent layer including the above material. The opposite electrode 123 may be integrally provided to correspond to the organic light-emitting diodes OLED and OLED' in the main display area MDA and the component area CA.

Layers from the first pixel electrode 121 and the opposite electrode 123 in the main display area MDA may configure the main organic light-emitting diode OLED. Layers from the second pixel electrode 121' to the opposite electrode 123 in the component area CA may configure the auxiliary organic light-emitting diode OLED'.

An upper layer 150 including an organic material may be on the opposite electrode 123. The upper layer 150 may be provided to protect the opposite electrode 123 and to improve light extraction efficiency. The upper layer 150 may include an organic material having a higher refractive index than that of the opposite electrode 123. Alternatively, the upper layer 150 may include stacked layers having different refractive indices. For example, the upper layer 150 may include a high refractive index layer/low refractive index layer/high refractive index layer. The high refractive index layer may have a refractive index of 1.7 or greater and the low refractive index layer may have a refractive index of 1.3 or less.

The upper layer 150 may additionally include LiF. Alternatively, the upper layer 150 may additionally include an inorganic insulating material such as silicon oxide ($SiO_2$) and silicon nitride (SiNx).

FIGS. 6A to 6D are cross-sectional views of the display panel taken along line I-I' of FIG. 4A. In FIGS. 6A to 6D, like reference numerals denote the same elements as those of FIG. 5.

Figure 6A:
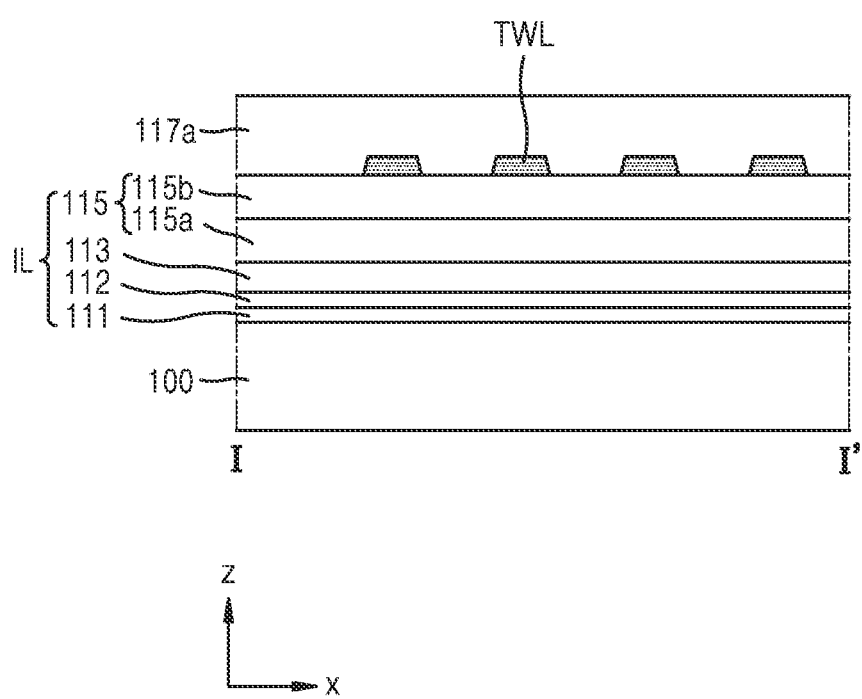
FIGS. 6A-6D are cross-sectional views of the display panel taken along the line I-I' of FIG. 4.

Referring to FIG. 6A, the connecting lines TWL in the component area may be at the same layer. For example, the connecting lines TWL may be on the interlayer insulating layer 115 as shown in FIG. 6A. According to some embodiments, the connecting lines TWL may be on the first gate insulating layer 112 or the second gate insulating layer 113. When the connecting lines TWL are at the same layer, an interval between the connecting lines TWL may be about 2 μm to about 6 μm. In addition, a width of each connecting line TWL in the x-direction may be about 2 μm to about 6 μm.

Figure 6B:
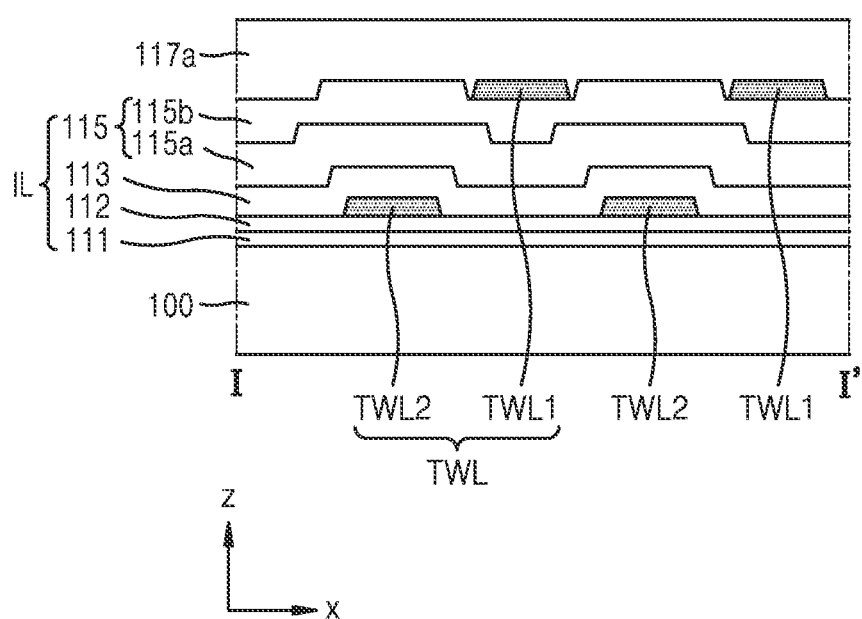
Figure 6C:
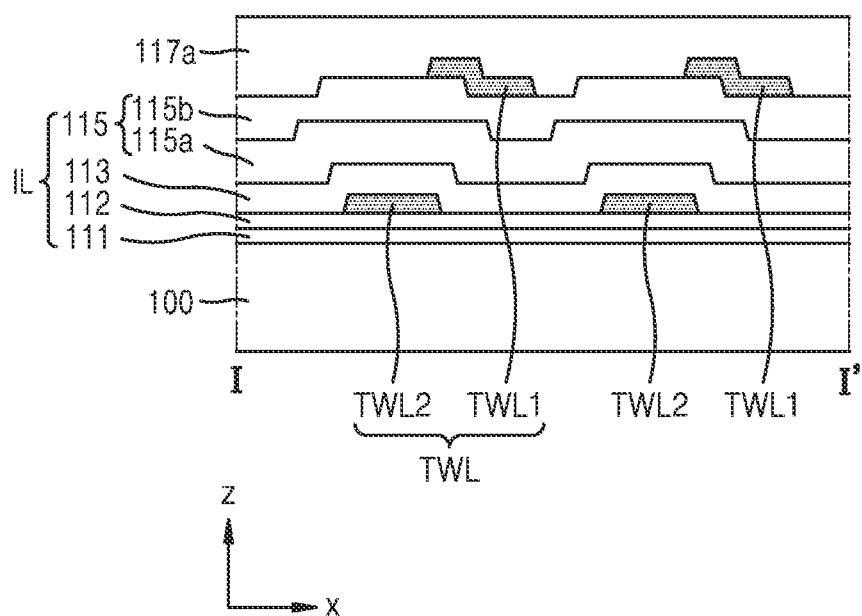
Figure 6D:
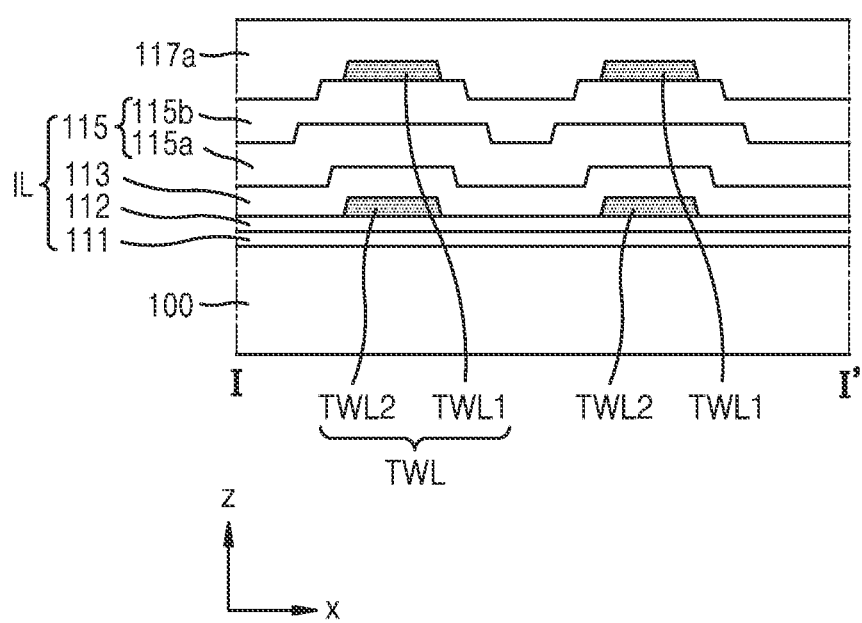

Referring to FIG. 6D, the connecting line TWL may include the first connecting line TWL1 and the second connecting line TWL2. The first connecting line TWL1 and the second connecting line TWL2 may be adjacent to each other. The first connecting line TWL1 and the second connecting line TWL2 at different layers are alternately arranged in the x-direction, that is, the second connecting line TWL2 may be between two first connecting lines TWL1 on a plane. Likewise, the first connecting line TWL1 may be between two second connecting lines TWL2 on a plane.

Due to the arrangement, a light diffraction intensity may be reduced. Because a component 40 using light may be under the component area CA in the display panel, it may be desirable that the diffraction of light incident into or emitted from the component 40 is reduced. According to some embodiments, the first connecting line TWL1 and the second connecting line TWL2 are alternately arranged and may be respectively between the first connecting lines TWL1 and between the second connecting lines TWL2 to reduce the light diffraction effect.

In some embodiments, the first connecting line TWL1 may be on the interlayer insulating layer 115 and the second connecting line TWL2 may be on the first gate insulating layer 112. However, one or more embodiments are not limited thereto. The second connecting line TWL2 may be variously arranged, e.g., may be between the first interlayer insulating layer 115a and the second interlayer insulating layer 115b or may be on the second gate insulating layer 113.

The first and second connecting lines TWL1 and TWL2 may include a transparent conductive material and may each have a thickness of about 400 Å to about 1200 Å. When the thickness of the first connecting line TWL1 and the second connecting line TWL2 is equal to or less than 400 Å, an RC delay may occur due to the resistance in the wiring. When the thickness of the first connecting line TWL1 and the second connecting line TWL2 is equal to or greater than 1200 Å, the light diffraction may increase due to an increase in the optical path. In addition, a tapered angle of a side surface in the first connecting line TWL1 and the second connecting line TWL2 may be 60□ or greater taking into account the diffraction effect.

The first connecting line TWL1 and the second connecting line TWL2 may each have a refractive index of about 1.8 to 2. In order to reduce the light diffraction effect, the first planarization layer 117a may include a material having a refractive index that is similar to that of the first connecting line TWL1. In some embodiments, a difference between the refractive index of the first planarization layer 117a and the refractive index of the first connecting line TWL1 may be about 0.4 or less. For example, the first planarization layer 117a may have a refractive index of about 1.6 to 1.7. In some embodiments, the first planarization layer 117a may include polyimide (PI).

FIG. 6B shows that the first connecting line TWL1 does not overlap the second connecting line TWL2, but one or more embodiments are not limited thereto. As shown in FIG. 6C, the first connecting line TWL1 may at least partially overlap the second connecting line TWL2. Even when the first connecting line TWL1 overlaps the second connecting line TWL2, the first connecting line TWL1 is between the second connecting lines TWL2, and thus, the light diffraction due to the space between the second connecting lines TWL2 may be reduced.

However, one or more embodiments are not limited thereto. In some cases, as shown in FIG. 6D, the first connecting line TWL1 may completely overlap the second connecting line TWL2.

Figure 7A:
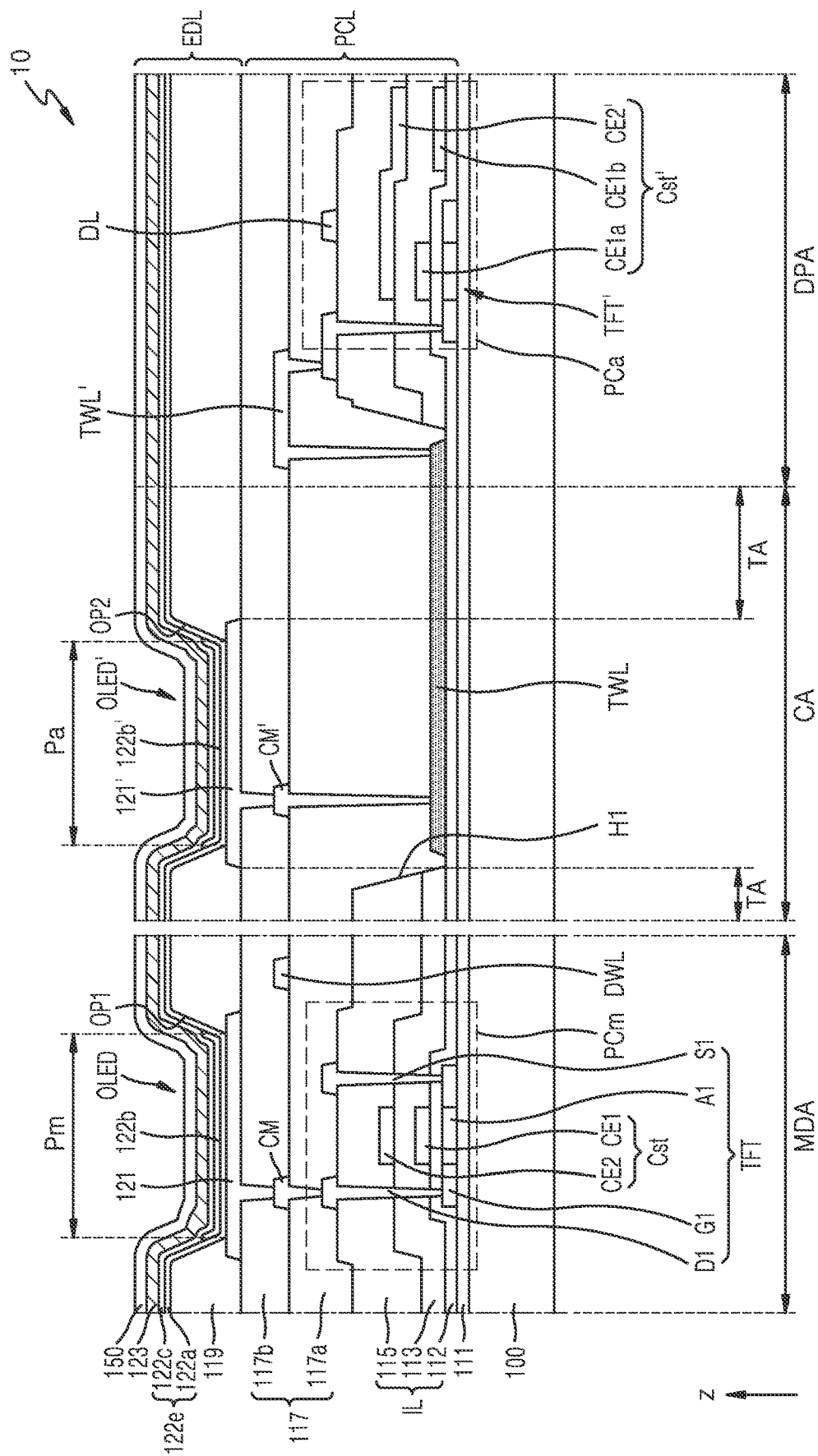
FIG. 7A is a cross-sectional view partially showing a display panel according to some embodiments.
Figure 7B:
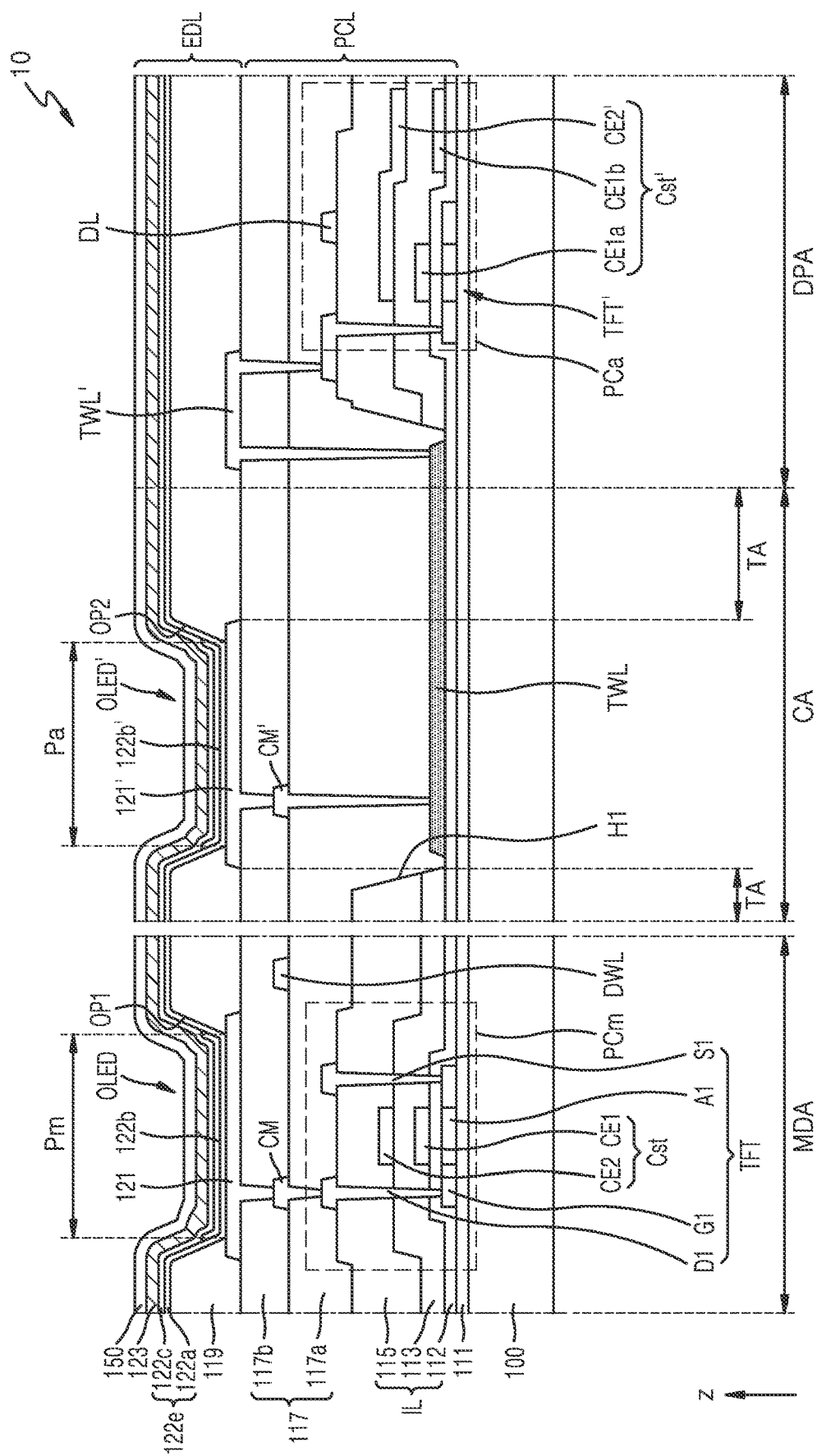
FIG. 7B is a cross-sectional view partially showing a display panel according to some embodiments.

FIGS. 7A and 7B are cross-sectional views showing some portions of the display panel 10 according to some embodiments of the present disclosure. In FIGS. 7A and 7B, like reference numerals denote the same elements as those of FIG. 5, and detailed descriptions thereof are omitted.

Referring to FIG. 7A, the display panel 10 may include the main display area MDA, the component area CA, and the peripheral area DPA. The main sub-pixels Pm are in the main display area MDA, and the component area CA includes the auxiliary sub-pixels Pa and the transmission area TA. The main pixel circuit PCm including the main thin film transistor TFT and the main storage capacitor Cst and the main organic light-emitting diode OLED that is a display element connected to the main pixel circuit PCm may be in the main display area MDA. The auxiliary organic light-emitting diode OLED' may be in the component area CA. The auxiliary pixel circuit PCa including an auxiliary thin film transistor TFT' and the auxiliary storage capacitor Cst' may be in the peripheral area DPA. In addition, the connecting line TWL for connecting the auxiliary pixel circuit PCa and the auxiliary organic light-emitting diode OLED' may be in the component area CA and the peripheral area DPA.

According to some embodiments, the inorganic insulating layer IL of the display panel 10 may have a hole corresponding to the component area CA.

For example, when the first gate insulating layer 112, the second gate insulating layer 113, and the interlayer insulating layer 115 are collectively referred to as the inorganic insulating layer IL, the interlayer insulating layer IL may include a first hole H1 corresponding to the transmission area TA. The first hole H1 may partially expose an upper surface of the buffer layer 111 or the substrate 100. The first hole H1 may be formed when an opening of the first interlayer insulating layer 112, an opening of the second gate insulating layer 113, and an opening of the interlayer insulating layer 115 overlap one another, wherein the holes correspond to the component area CA. The openings may be separately formed through separate processes or simultaneously formed through the same process. When the openings are separately formed through separate processes, an internal surface of the first hole H1 may not be smoothly formed, but may have steps.

According to some embodiments, the connecting line TWL may be in the first hole H1. The connecting line TWL may be on the buffer layer 111 in the component area CA. The connecting line TWL may be connected to the additional connecting line TWL' on the first planarization layer 117a via a contact hole and may be connected to the auxiliary pixel circuit PCa via the additional connecting line TWL'. An opposite end of the connecting line TWL is connected to the connecting electrode CM' via a contact hole and may be connected to the second pixel electrode 121' via the connecting electrode CM'.

In FIG. 7A, the additional connecting line TWL' is on the first planarization layer 117a, but one or more embodiments are not limited thereto. The additional connecting line TWL' may be on the second planarization layer 117b as shown in FIG. 7B. That is, the additional connecting line TWL' may be at the same layer as that of the pixel electrode 121. In addition, the location of the additional connecting line TWL' may be variously modified, that is, the additional connecting line TWL' may be at the same layer as that of the gate electrode G1 of the thin film transistor TFT or at the same layer as that of the upper electrode CE2 of the storage capacitor Cst.

Figure 8:
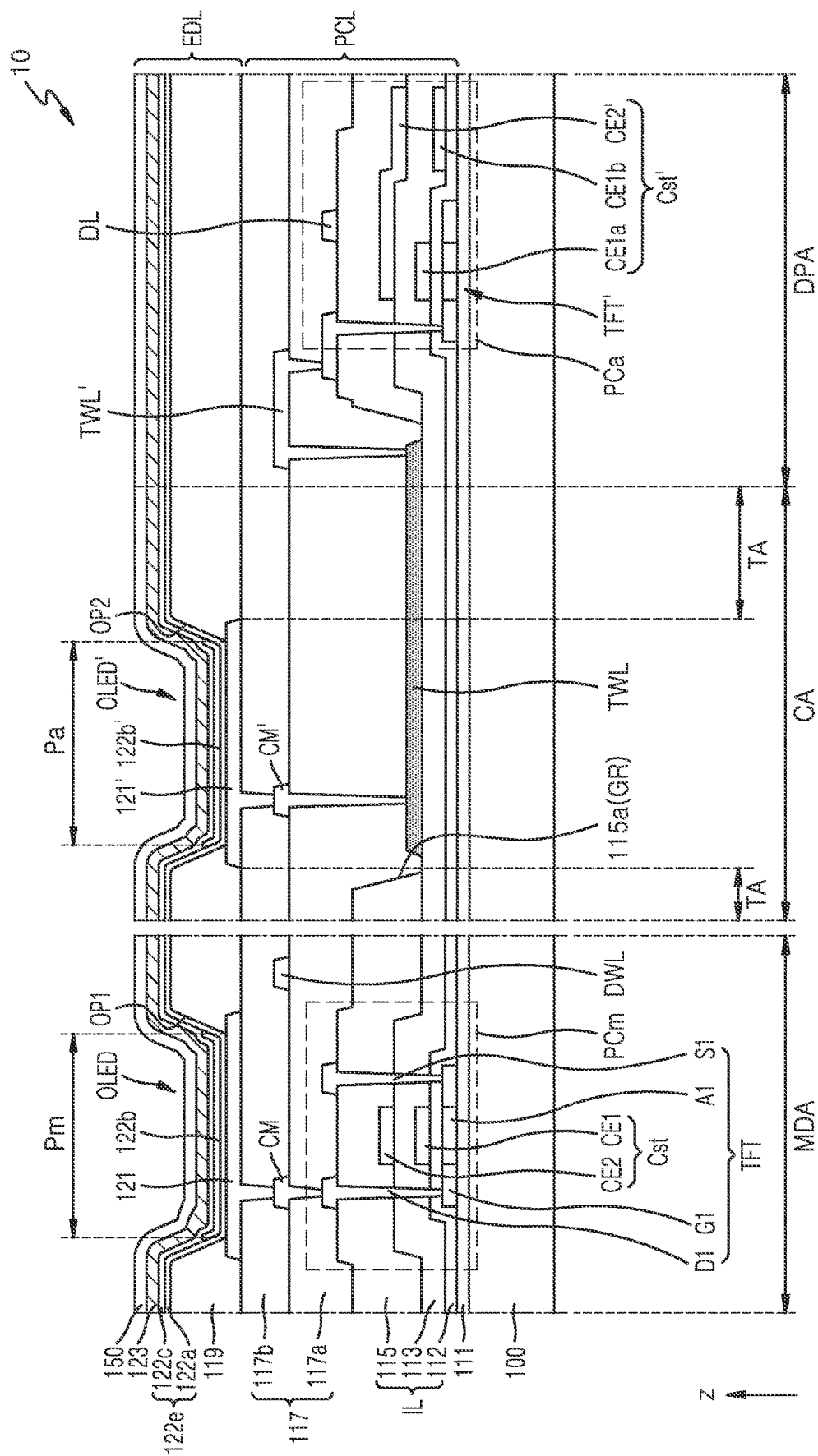
FIG. 8 is a cross-sectional view partially showing a display panel according to some embodiments.

FIG. 8 is a cross-sectional view partially showing the display panel 10 according to some embodiments of the present disclosure. In FIG. 8, like reference numerals denote the same elements as those of FIG. 5, and detailed descriptions thereof are omitted.

Referring to FIG. 8, the inorganic insulating layer IL of the display panel 10 may have a groove GR corresponding to the component area CA. For example, when the first gate insulating layer 112, the second gate insulating layer 113, and the interlayer insulating layer 115 are collectively referred to as the inorganic insulating layer IL, the first gate insulating layer 112 and the second gate insulating layer 113 are continuously arranged throughout the component area CA, and the interlayer insulating layer 115 may include an opening 115a corresponding to the component area CA. Alternatively, unlike the example shown in FIG. 8, the first gate insulating layer 112 or the second gate insulating layer 113 may include an opening corresponding to the component area CA. Accordingly, the groove GR may be obtained by partially removing the inorganic insulating layer IL. The groove GR may be obtained by removing a layer including silicon nitride SiNx from among the layers included in the inorganic insulating layer IL. Because the silicon nitride SiNx has high reflectivity, the light transmittance of the component area CA may be improved by removing the layer including silicon nitride (XiNx).

According to some embodiments, the connecting line TWL may be on the second gate insulating layer 113 in the groove GR. The connecting line TWL may be connected to the auxiliary pixel circuit PCa via the additional connecting line TWL' on the first planarization layer 117a.

Figure 9:
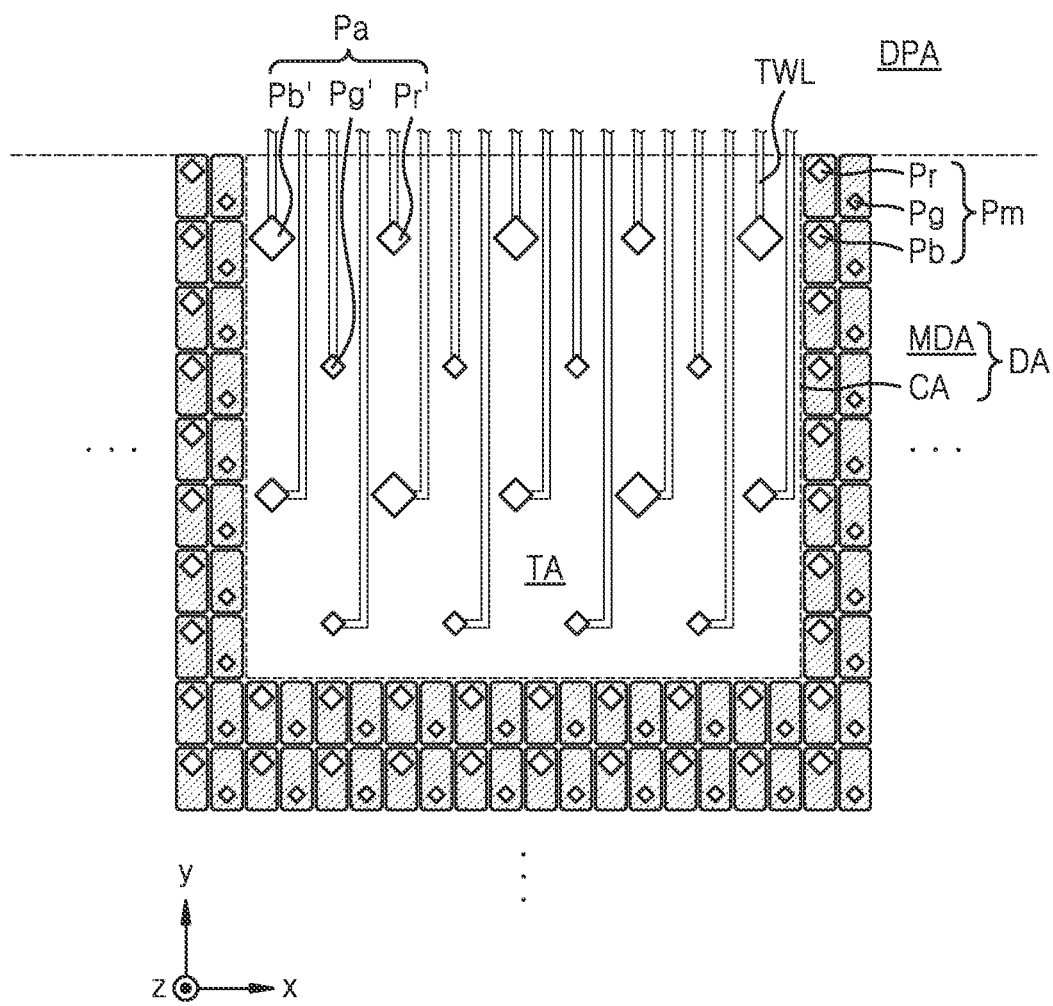
FIG. 9 is a plan layout showing a partial area of a display panel according to some embodiments.

FIG. 9 is a plan layout showing a partial area of a display panel according to some embodiments of the present disclosure.

Referring to FIG. 9, the auxiliary pixel circuit PCa (see FIG. 4) is not in the component area CA of the display panel, and the auxiliary sub-pixels Pa implemented as the display elements are only in the component area CA. Also, the connecting line TWL connecting the auxiliary pixel circuit PCa to the auxiliary sub-pixel Pa is in the component area CA. The connecting line TWL may include a transparent conductive material.

According to some embodiments, a size of the auxiliary sub-pixel Pa may be greater than that of the main sub-pixel Pm emitting the same color. For example, the first sub-pixel Pr' emitting red light among the auxiliary sub-pixels Pa may have a greater size than that of the first sub-pixel Pr emitting red light among the main sub-pixels Pm. The second sub-pixel Pg' emitting green light among the auxiliary sub-pixels Pa may have a greater size than that of the second sub-pixel Pg emitting green light among the main sub-pixels Pm. The third sub-pixel Pb' emitting blue light among the auxiliary sub-pixels Pa may have a greater size than that of the third sub-pixel Pb emitting blue light among the main sub-pixels Pm. The size difference may be designed taking into account a difference between luminance and/or resolutions of the component area CA and the main display area MDA. Also, the auxiliary sub-pixels Pa are arranged in the Pentile™ structure and may be entirely distributed in the component area CA.

The plurality of connecting lines TWL may extend from the peripheral area DPA above the component area CA in a −y direction. In some embodiments, the connecting lines TWL may extend to the location of the auxiliary sub-pixels Pa to be connected respectively to the auxiliary sub-pixels Pa. That is, the connecting line TWL may be connected to the second pixel electrode 121' (see FIG. 5) implementing the auxiliary sub-pixel Pa. According to some embodiments, the connecting line TWL may extend to a lower portion of the component area CA beyond the auxiliary sub-pixels Pa.

Figure 10:
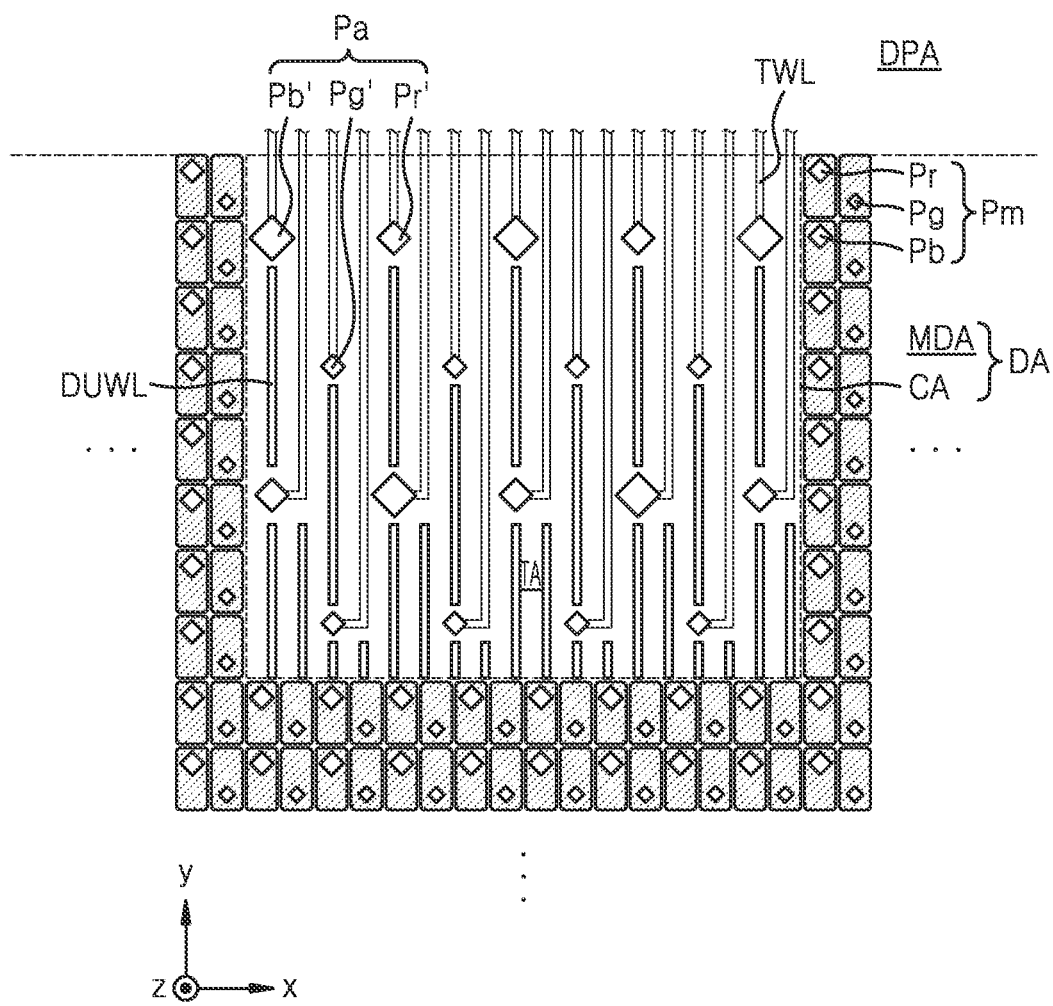
FIG. 10 is a plan layout showing a portion of a display panel according to some embodiments.

FIG. 10 is a plan layout showing a portion of a display panel according to some embodiments of the present disclosure. In FIG. 10, like reference numerals denote the same elements as those of FIG. 9.

Referring to FIG. 10, the auxiliary pixel circuit PCa (see FIG. 4) is not in the component area CA of the display panel, and the auxiliary sub-pixels Pa implemented as the display elements are only in the component area CA. Also, the connecting line TWL connecting the auxiliary pixel circuit PCa to the auxiliary sub-pixel Pa is in the component area CA. The connecting line TWL may include a transparent conductive material. The connecting line TWL may extend to the location of the auxiliary sub-pixel Pa connected thereto.

According to some embodiments, a dummy line DUWL may be in the component area CA. The dummy line DUWL may include a transparent conductive material. The dummy line DUWL may be in a region of the component area CA, where the connecting line TWL is not located. The dummy line DUWL may be spaced apart from the connecting line TWL and may extend in the y direction. The dummy line DUWL may be on the same line as that of the connecting line TWL. Alternatively, the dummy line DUWL may extend in the y direction between the first sub-pixel Pr' and the third sub-pixel Pb' on the same column.

When there is no dummy line DUWL, each connecting line TWL extends to the location of the auxiliary sub-pixel Pa connected thereto, and thus, there may be an empty space between the first sub-pixel Pr' and the third sub-pixel Pb' on the same column. Due to the empty space, the light diffraction may unevenly occur. According to some embodiments, the dummy line DUWL is adopted, such that the light diffraction intensity may be even in the component area CA. Accordingly, the image of the component or the component area CA may be easily compensated for according to the light diffraction effect.

Figure 11:
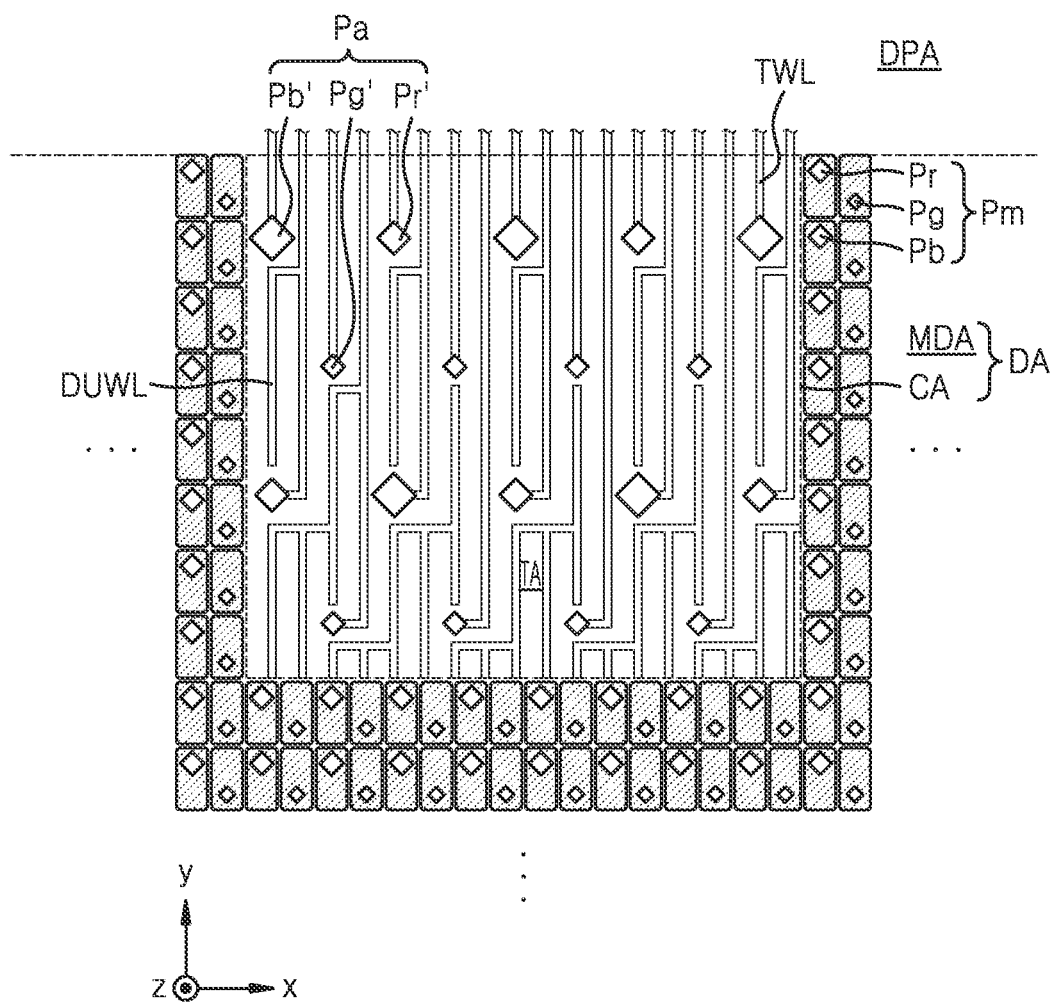
FIG. 11 is a plan layout showing a portion of a display panel according to some embodiments.

FIG. 11 is a plan layout showing a portion of a display panel according to some embodiments of the present disclosure. In FIG. 11, like reference numerals denote the same elements as those of FIG. 9.

Referring to FIG. 11, the auxiliary pixel circuit PCa (see FIG. 4) is not in the component area CA of the display panel, and the auxiliary sub-pixels Pa implemented as the display elements are only in the component area CA. Also, the connecting line TWL connecting the auxiliary pixel circuit PCa to the auxiliary sub-pixel Pa is in the component area CA. The connecting line TWL may include a transparent conductive material. The connecting line TWL may extend to the location of the auxiliary sub-pixel Pa connected thereto.

According to some embodiments, a dummy line DUWL may be in the component area CA. The dummy line DUWL may include a transparent conductive material. The dummy line DUWL may be in a region of the component area CA, where the connecting line TWL is not located. The dummy line DUWL may be integrally provided with the connecting line TWL. That is, the dummy line DUWL may be branched from a part of the connecting line TWL and may extend in the y direction. Because the dummy line DUWL is integrally provided with the connecting line TWL, the resistance of the connecting line TWL may be reduced. Alternatively, the branched dummy line DUWL may extend in the y direction between the first sub-pixel Pr' and the third sub-pixel Pb' on the same column.

Figure 12:
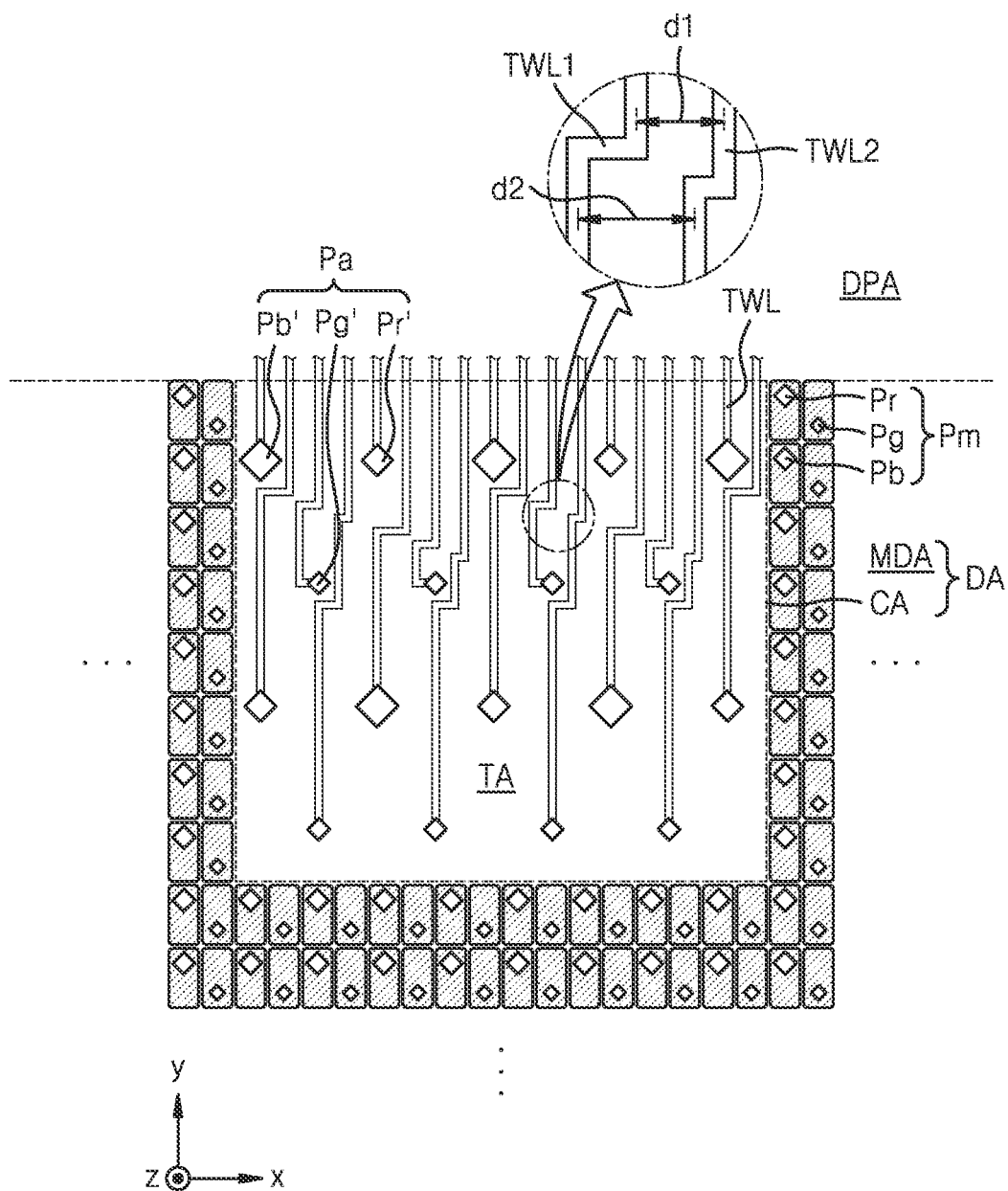
FIG. 12 is a plan layout showing a portion of a display panel according to some embodiments.
Figure 13:
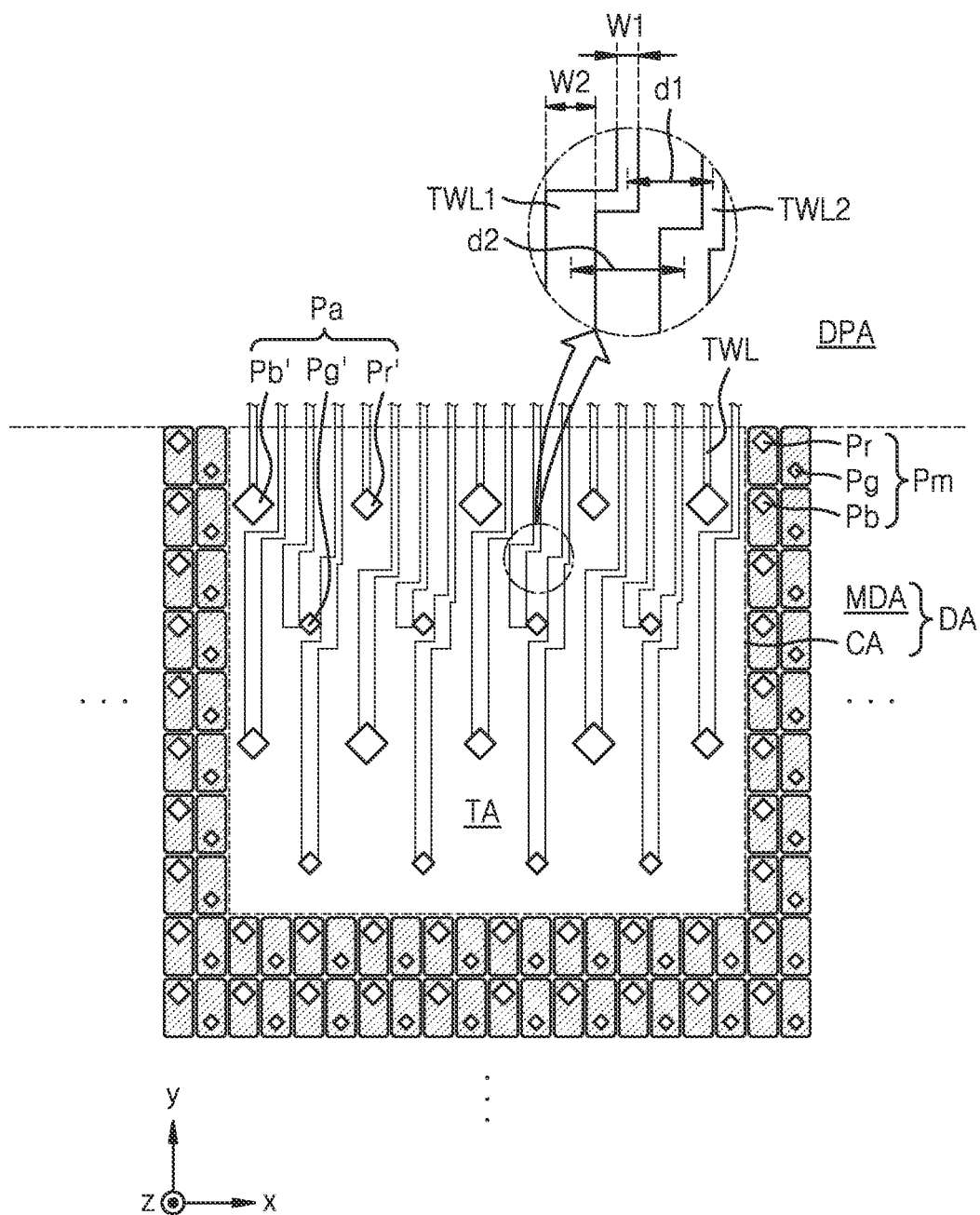
FIG. 13 is a plan layout showing a portion of a display panel according to some embodiments.

FIGS. 12 and 13 are plan layouts showing a portion of a display panel according to some embodiments of the present disclosure. In FIGS. 12 and 13, like reference numerals denote the same elements as those of FIG. 9.

Referring to FIG. 12, the auxiliary pixel circuit PCa (see FIG. 4) is not in the component area CA of the display panel, and the auxiliary sub-pixels Pa implemented as the display elements are only in the component area CA. Also, the connecting line TWL connecting the auxiliary pixel circuit PCa to the auxiliary sub-pixel Pa is in the component area CA. The connecting line TWL may include a transparent conductive material. The connecting line TWL may extend to the location of the auxiliary sub-pixel Pa connected thereto.

According to some embodiments, an interval between centers of the adjacent connecting lines TWL may not be consistent. For example, the first connecting line TWL1 and the second connecting line TWL2 adjacent to each other may have a first distance d1 between centers thereof, in a region adjacent to the auxiliary pixel circuit PCa (see FIG. 4) or the peripheral area DPA. In addition, the first connecting line TWL1 and the second connecting line TWL2 may have a second distance d2 between centers thereof, wherein the second distance d2 is greater than the first distance d1, in a region away from the peripheral area DPA. The arrangement may be provided to ensure uniform light diffraction intensity in the x direction by making the intervals among the connecting lines TWL in the x direction constant.

Due to the above arrangement, the connecting lines TWL extend in −y direction, and at least some of the connecting lines TWL may include bent portions. Alternatively, at least some of the connecting lines TWL may be curved.

In FIG. 12, widths of the connecting lines TWL are constant, but one or more embodiments are not limited thereto. As shown in FIG. 13, the connecting line TWL may have a region having a first width W1 and a region having a second width W2 based on the bent portion, wherein the second width W2 is greater than the first width W1. The region having the first width W1 in the connecting line TWL may be adjacent to the peripheral area DPA. The region having the second width W2 in the connecting line TWL may be far from the peripheral area DPA. Because the connecting line TWL has the second width W2 that is greater than the first width W1, the resistance of the connecting line TWL may be reduced.

In addition, in FIGS. 12 and 13, the connecting line TWL extends to the location of the auxiliary sub-pixel Pa connected thereto, but one or more embodiments are not limited thereto. The connecting lines TWL may extend from one end to the opposite end of the component area CA.

Also, the dummy lines shown in FIGS. 10 and 11 may be applied to the embodiments shown in FIGS. 12 and 13.

While the disclosure has been particularly shown and described with reference to aspects of some example embodiments thereof, it will be understood by those of ordinary skill in the art that various changes in form and details may be made therein without departing from the spirit and scope as defined by the following claims. Therefore, the scope sought to be protected of the disclosure shall be defined by the appended claims, and their equivalents.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
   a substrate including a main display area, a component area, and a peripheral area;
   a main sub-pixel and a main pixel circuit, the main sub-pixel being in the main display area on the substrate, and the main pixel circuit being connected to the main sub-pixel;
   a plurality of auxiliary sub-pixels in the component area on the substrate;
   a plurality of auxiliary pixel circuits in the peripheral area on the substrate; and
   a plurality of connecting lines connecting the plurality of auxiliary sub-pixels to the plurality of auxiliary pixel circuits, respectively;
   wherein the plurality of connecting lines include a first connecting line and a second connecting line adjacent to each other, and include portions having different intervals from each other between centers of the first connecting line and the second connecting line in the component area.

2. The display panel of claim 1, wherein the first connecting line has a first width and a second width that are different from each other.

3. The display panel of claim 1, wherein the first connecting line and the second connecting line each include a bent portion.

4. The display panel of claim 1, wherein the first connecting line and the second connecting line are each comprise a plurality of first connecting lines and a plurality of second connecting lines, respectively,
   the plurality of first connecting lines are at a different layer from the plurality of second connecting lines, and
   at least one of the plurality of first connecting lines is between two adjacent second connecting lines from among the plurality of second connecting lines.

5. The display panel of claim 4, wherein the plurality of first connecting lines at least partially overlap the plurality of second connecting lines.

6. The display panel of claim 1, wherein, among the plurality of auxiliary sub-pixels, an auxiliary sub-pixel emitting light of a same color as the main sub-pixel has a size greater than a size of the main sub-pixel.

7. The display panel of claim 1, further comprising additional connecting lines connecting the plurality of connecting lines to the plurality of auxiliary pixel circuits, wherein the additional connecting lines include a material different from a material in the connecting lines.

* * * * *